United States Patent
Kim et al.

(10) Patent No.: US 10,692,820 B2
(45) Date of Patent: Jun. 23, 2020

(54) HYBRID COMPOSITE FILM, METHOD OF FABRICATING THE SAME, AND INTEGRATED CIRCUIT DEVICE INCLUDING HYBRID COMPOSITE FILM

(71) Applicant: SAMSUNG ELECTRONICS CO., LTD., Suwon-si, Gyeonggi-do (KR)

(72) Inventors: Seung-won Kim, Hwaseong-si (KR); Jun-won Han, Seoul (KR); Yeon-woo Kim, Hwaseong-si (KR); Hye-yun Park, Hwaseong-si (KR); Cheol-sang Yoon, Seoul (KR); Kangtaek Lee, Seoul (KR); Hyungjoon Jeon, Seoul (KR); Young-Geon Song, Seoul (KR)

(73) Assignees: SAMSUNG ELECTRONICS CO., LTD., Suwon-si, Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 16/197,957

(22) Filed: Nov. 21, 2018

(65) Prior Publication Data
US 2019/0157217 A1    May 23, 2019

(30) Foreign Application Priority Data

Nov. 22, 2017 (KR) .......................... 10-2017-0156606
Oct. 11, 2018 (KR) .......................... 10-2018-0121196

(51) Int. Cl.
*C01G 53/00* (2006.01)
*H01M 4/505* (2010.01)
(Continued)

(52) U.S. Cl.
CPC .............. *H01L 23/562* (2013.01); *C09C 1/04* (2013.01); *C09C 3/08* (2013.01); *C09C 3/12* (2013.01);
(Continued)

(58) Field of Classification Search
CPC ............. H01L 23/572; H01L 21/02118; H01L 21/02282; H01L 23/3737; H01L 23/49811;
(Continued)

(56) References Cited

U.S. PATENT DOCUMENTS 6,462,141 B1 * 10/2002 Kim ........................ C08C 19/25
524/572
7,611,750 B2    11/2009 Yi et al.
(Continued)

FOREIGN PATENT DOCUMENTS

JP        10-087990 A      7/1998
JP        2016-153500 A    8/2016
(Continued)

OTHER PUBLICATIONS

H. Jeon, et al., "Reducing the coefficient of thermal expansion of polyimide films using ZnS particles at low Reducing the coefficient of thermal expansion of polyimide films", ACS Appl. Nano Mater., 2018, 1, 1076-1082.

*Primary Examiner* — Ly D Pham
(74) *Attorney, Agent, or Firm* — Lee IP Law, P.C.

(57) ABSTRACT

A hybrid composite film, a method of fabricating the hybrid composite film, and an integrated circuit device including the hybrid composite film, the hybrid composite film including a polymer film; and a plurality of organic-inorganic composite particles dispersed in the polymer film, wherein each particle of the plurality of organic-inorganic composite particles includes an inorganic particle and an organic cap-
(Continued)

ping layer surrounding the inorganic particle, the organic capping layer having a hydroxyl group-terminated end.

14 Claims, 20 Drawing Sheets

(51) Int. Cl.

| | | |
|---|---|---|
| *H01M 4/525* | (2010.01) | |
| *C01B 39/48* | (2006.01) | |
| *H01M 10/0525* | (2010.01) | |
| *H01L 23/00* | (2006.01) | |
| *H01L 21/02* | (2006.01) | |
| *H01L 23/373* | (2006.01) | |
| *C09C 1/04* | (2006.01) | |
| *C09C 3/08* | (2006.01) | |
| *H01L 23/498* | (2006.01) | |
| *C09C 3/12* | (2006.01) | |
| *C09D 179/00* | (2006.01) | |

(52) U.S. Cl.
CPC ...... *C09D 179/00* (2013.01); *H01L 21/02118* (2013.01); *H01L 21/02282* (2013.01); *H01L 23/3737* (2013.01); *H01L 23/49811* (2013.01); *H01L 23/49833* (2013.01); *C01P 2002/70* (2013.01); *C01P 2002/84* (2013.01); *C01P 2004/03* (2013.01); *C01P 2004/04* (2013.01); *C01P 2004/62* (2013.01); *C01P 2004/64* (2013.01); *H01L 2224/18* (2013.01)

(58) Field of Classification Search
CPC . H01L 23/49833; H01L 2224/18; C01C 1/04; C01C 3/08; C01C 3/12; C09D 179/00; C01P 2002/70; C01P 2002/84; C01P 2004/03; C01P 2004/04; C01P 2004/62; C01P 2004/64

See application file for complete search history.

(56) References Cited

U.S. PATENT DOCUMENTS

| | | | |
|---|---|---|---|
| 8,093,139 | B2 | 1/2012 | Krivoshlykov |
| 2004/0151910 | A1* | 8/2004 | Koller ................. C08F 2/44 |
| | | | 428/403 |
| 2006/0127686 | A1 | 6/2006 | Meloni |
| 2008/0004175 | A1* | 1/2008 | Aoshima ............. B01J 31/123 |
| | | | 502/159 |
| 2012/0139097 | A1 | 6/2012 | Jin et al. |
| 2016/0217920 | A1* | 7/2016 | Choi ................. H01F 17/0013 |
| 2018/0052547 | A1* | 2/2018 | Hu ..................... G06F 3/0412 |
| 2019/0153290 | A1* | 5/2019 | Katou ................. C08K 5/5419 |
| 2019/0276722 | A1* | 9/2019 | Loeblein ............... C08K 7/24 |

FOREIGN PATENT DOCUMENTS

| | | |
|---|---|---|
| KR | 10-2010-0124623 A | 11/2010 |
| KR | 10-1482491 B1 | 1/2015 |

\* cited by examiner

|  | COMPARATIVE EXAMPLE | EXAMPLE 1 | EXAMPLE 2 | EXAMPLE 3 | EXAMPLE 4 |
|---|---|---|---|---|---|
| INTRINSIC CTE (ppm/K) | 39.0 | 6.36 | 6.36 | 0.55 | −9.0 |
| Thermal conductivity (W/m·K) | 0.27 | 25.1 | 25.1 | 1.3~1.5 | 0.5 |
| HYBRID COMPOSITE FILM CTE (ppm/K) | − | 20.8 | 12.0 | 30.2 | 33.0 |

| Sample | Tensile Strength (N/mm$^2$) | Tensile Modulus (N/mm$^2$) | Elongation (%) |
|---|---|---|---|
| COMPARATIVE EXAMPLE | 56.31 ± 8.6 | 1756 ± 147 | 7.15 ± 2.6 |
| EXAMPLE 2 | 87.69 ± 0.5 | 3306 ± 236 | 5.25 ± 0.9 |

HYBRID COMPOSITE FILM, METHOD OF FABRICATING THE SAME, AND INTEGRATED CIRCUIT DEVICE INCLUDING HYBRID COMPOSITE FILM

CROSS-REFERENCE TO RELATED APPLICATIONS

Korean Patent Application Nos. 10-2017-0156606 and 10-2018-0121196 filed on Nov. 22, 2017 and Oct. 11, 2018 in the Korean Intellectual Property Office, and entitled: "Hybrid Composite Film, Method of Fabricating the Same, and Integrated Circuit Device Including Hybrid Composite Film," is incorporated by reference herein in its entirety.

BACKGROUND

1. Field

Embodiments relate to a hybrid composite film, a method of fabricating the hybrid composite film, and an integrated circuit device including the hybrid composite film.

2. Description of the Related Art

Integrated circuit devices may include a complex and fine multilayered thin-film structure that is based on silicon.

SUMMARY

The embodiments may be realized by providing a hybrid composite film including a polymer film; and a plurality of organic-inorganic composite particles dispersed in the polymer film, wherein each particle of the plurality of organic-inorganic composite particles includes an inorganic particle and an organic capping layer surrounding the inorganic particle, the organic capping layer having a hydroxyl group-terminated end.

The embodiments may be realized by providing a method of fabricating a hybrid composite film, the method including forming a plurality of inorganic particles; forming a plurality of organic-inorganic composite particles by forming an organic capping layer on a surface of each particle of the plurality of inorganic particles, the organic capping layer having a hydroxyl group-terminated end; forming an organic-inorganic composite particle-dispersed solution by dispersing the plurality of organic-inorganic composite particles in a solvent; forming a liquid mixture of the organic-inorganic composite particle-dispersed solution with a polymer precursor composition; forming a coating film from the liquid mixture; and curing the coating film.

The embodiments may be realized by providing an integrated circuit device including a semiconductor device; and a hybrid composite film covering the semiconductor device, wherein the hybrid composite film includes a polymer film and a plurality of organic-inorganic composite particles dispersed in the polymer film, and each particle of the plurality of organic-inorganic composite particles includes an inorganic particle and an organic capping layer surrounding the inorganic particle, the organic capping layer having a hydroxyl group-terminated end.

BRIEF DESCRIPTION OF THE DRAWINGS

Features will be apparent to those of skill in the art by describing in detail exemplary embodiments with reference to the attached drawings in which.

DETAILED DESCRIPTION

As used herein, the term "room temperature" or "ambient temperature" refers to a temperature ranging from about 20°

C. to about 28° C., and may vary with the seasons. As used herein, the term "nanoparticles" refer to particles having diameters of about 1 nm to about 900 nm. As used herein, the term "nanocomposite" refers to a composite based on a polymer including nanoparticles.

Figure 1:
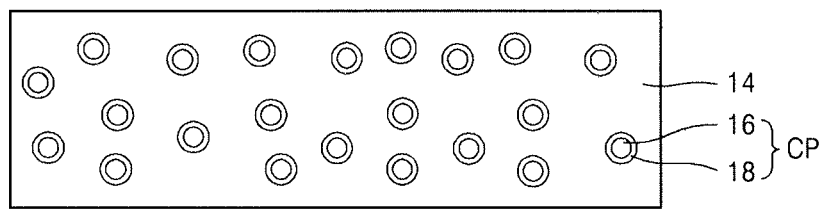
FIG. 1 illustrates a schematic partial cross-sectional view of a hybrid composite film according to an embodiment.

FIG. 1 illustrates a schematic partial cross-sectional view of a hybrid composite film according to an embodiment.

Referring to FIG. 1, a hybrid composite film 10 may include a polymer film 14 and a plurality of organic-inorganic composite particles CP dispersed in the polymer film 14. Each of the plurality of organic-inorganic composite particles CP may include an inorganic particle 16 and an organic capping layer 18 surrounding the inorganic particle 16.

The polymer film 14 may include an organic polymer, an inorganic polymer, or a combination thereof. The organic polymer may include, e.g., polyimide, novolac resins, polyhydroxystyrene, polybenzoxazole, or benzocyclobutene resins. The inorganic polymer may include, e.g., polysilazane, polysiloxane, polysilane, or polycarbosilane.

The inorganic particle 16 may be present in an amount of, e.g., about 1% by weight (wt %) to about 25 wt %, in the hybrid composite film 10, based on a total weight of the polymer film 14 and the inorganic particle 16.

In each organic-inorganic composite particle CP, the organic capping layer 18 may be maintained bonded to a surface of the inorganic particle 16 due to an interaction therebetween.

In an implementation, the inorganic particle 16 may have a particle size of, e.g., about 1 nm to about 900 nm. In an implementation, the inorganic particle 16 may have a particle size of, e.g., about 1 nm to about 300 nm. As used herein, the term "particle size" refers to a maximum dimension, e.g., maximum length, of an object particle.

The inorganic particle 16 may include, e.g., an inorganic sulfide, an inorganic nitride, an inorganic oxide, or a combination thereof. In an implementation, the inorganic particle 16 may include, e.g., ZnS, AlN, BN, or a combination thereof.

The organic capping layer 18 included in each organic-inorganic composite particle CP may help suppress agglomeration of a plurality of inorganic particles 16.

Figure 2:
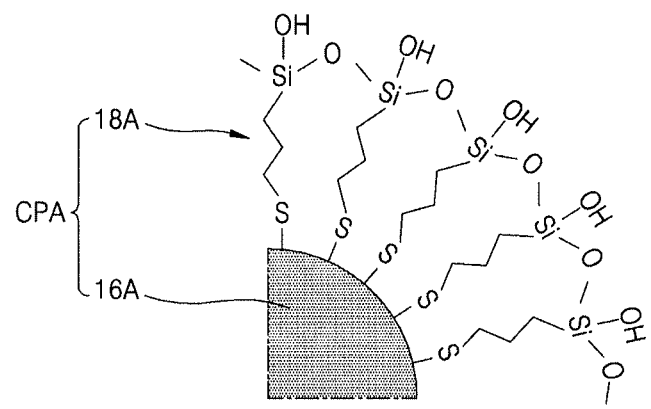
FIG. 2 illustrates a diagram of an example of an organic-inorganic composite particle included in a hybrid composite film according to an embodiment.

FIG. 2 illustrates a diagram of an example of the organic-inorganic composite particle CP shown in FIG. 1. FIG. 2 illustrates a partial configuration of an organic-inorganic composite particle CPA that may be used as the organic-inorganic composite particle CP shown in FIG. 1.

The organic-inorganic composite particle CPA may include an inorganic particle 16A and an organic capping layer 18A surrounding the inorganic particle 16A. Details of the inorganic particle 16A are as described regarding the inorganic particle 16 with reference to FIG. 1.

In an implementation, the organic capping layer 18A may include an organic monolayer surrounding the inorganic particle 16A. In an implementation, the organic capping layer 18A may be bonded to a surface of the inorganic particle 16A via, e.g., a thiol derivative used as an anchoring group. The organic capping layer 18A may provide an outer surface of the organic-inorganic composite particle CPA and may have a hydroxyl group-terminated end. As such, the organic capping layer 18A may have a hydroxyl group-terminated end, a hydroxyl group may be exposed on the outer surface of the organic-inorganic composite particle CPA, and the organic-inorganic composite particle CPA may have a hydroxyl group-terminated outer surface.

The organic capping layer 18A may include, e.g., a siloxane linkage. In an implementation, the organic capping layer 18A may include, e.g., a silanol group. The organic capping layer 18A may include, e.g., a C1 to C10 alkylene group. In an implementation, as illustrated in FIG. 2, the organic capping layer 18A may include a C3 trimethylene group as the alkylene group set forth above.

In an implementation, as shown in FIG. 2, the organic capping layer 18A may be bonded to the surface of the inorganic particle 16A via a thiol derivative used as an anchoring group and may have a 3-dimensional network structure including a siloxane linkage (—Si—O—Si—) as a backbone. In an implementation, in each organic-inorganic composite particle CP shown in FIG. 1, the organic capping layer 18 may be bonded to the surface of the inorganic particle 16 in various manners and may not have a 3-dimensional network structure.

Figure 3:
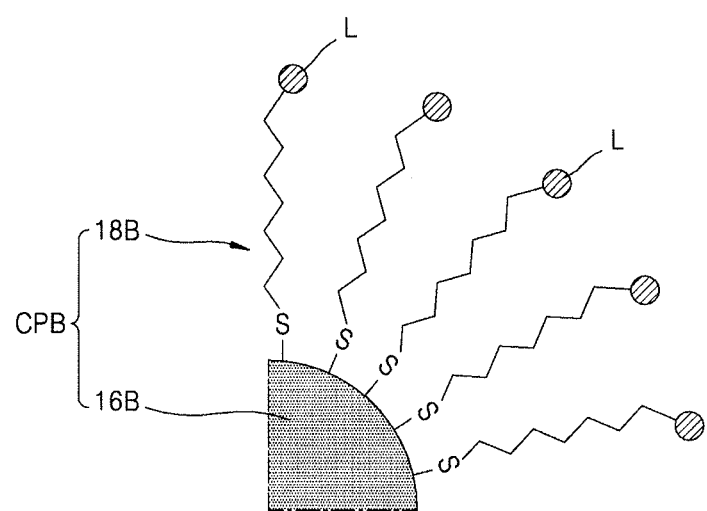
FIG. 3 illustrates a diagram of another example of an organic-inorganic composite particle included in a hybrid composite film according to an embodiment.

FIG. 3 illustrates another example of the organic-inorganic composite particle CP shown in FIG. 1. FIG. 3 illustrates a partial configuration of an organic-inorganic composite particle CPB that may be used as the organic-inorganic composite particle CP shown in FIG. 1.

The organic-inorganic composite particle CPB may include an inorganic particle 16B and an organic capping layer 18B surrounding the inorganic particle 16B. Details of the inorganic particle 16B are as described regarding the inorganic particle 16 with reference to FIG. 1.

In an implementation, the organic capping layer 18B may be bonded to a surface of the inorganic particle 16B via, e.g., a thiol derivative used as an anchoring group, similarly to the case of the organic capping layer 18A described with reference to FIG. 2. In an implementation, the organic capping layer 18B may not have a 3-dimensional network structure. The organic capping layer 18B may include an organic monolayer surrounding the inorganic particle 16B. In an implementation, the organic monolayer constituting the organic capping layer 18B may include, at an end, a hydrophilic ligand L terminated with a hydroxyl group. In an implementation, the hydrophilic ligand L may include, e.g., a silanol group.

Referring again to FIG. 1, the hybrid composite film 10 may be used in place of other organic insulating films in integrated circuit devices. The organic-inorganic composite particles CP included in the hybrid composite film 10 may include the plurality of inorganic particles 16 having relatively low coefficients of thermal expansion and relatively high thermal conductivity, thereby reducing a coefficient of thermal expansion of the hybrid composite film 10 including the polymer film 14. Therefore, the coefficient of thermal expansion of the hybrid composite film 10 including the polymer film 14 may be controlled by controlling an amount of the plurality of inorganic particles 16 included in the hybrid composite film 10.

The hybrid composite film 10 may be used as an insulating film of various purposes in integrated circuit devices having various shapes and various functions. For example, the hybrid composite film 10 may constitute: a protective film protecting a circuit substrate of an integrated circuit device; a base film of the circuit substrate; an insulating layer of the circuit substrate; or an interlayer dielectric of the integrated circuit device. In an implementation, the hybrid composite film 10 may be used as an insulating film in a wafer level package, thereby preventing the wafer level package from suffering from defects such as interface cracking, peeling-off, or the like due to thermal expansion.

Figure 4:
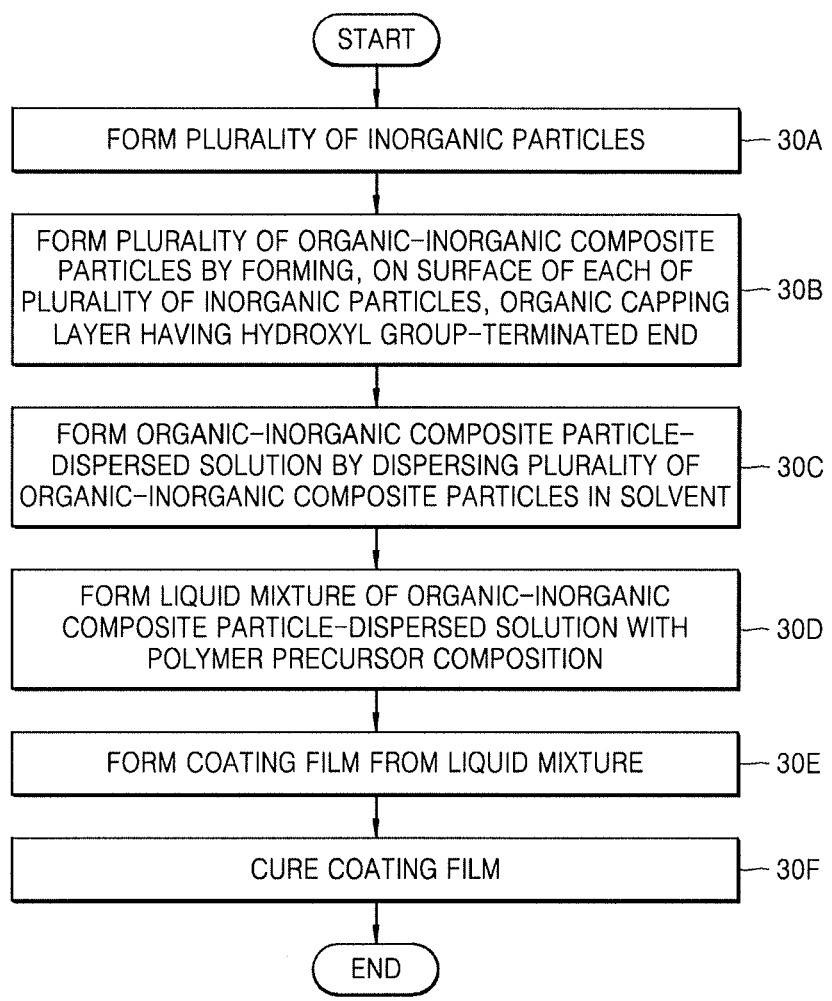
FIG. 4 illustrates a schematic flowchart of a method of fabricating a hybrid composite film, according an embodiment.

FIG. 4 illustrates a schematic flowchart of a method of fabricating a hybrid composite film, according to embodiments. A method of fabricating the hybrid composite film 10 shown in FIG. 1 will be described with reference to FIGS. 1 and 4.

In a process 30A of FIG. 4, the plurality of inorganic particles 16 may be formed.

In an implementation, each of the plurality of inorganic particles 16 may have a particle size of about 1 nm to about 900 nm, e.g., about 1 nm to about 300 nm.

In a process 30B of FIG. 4, the organic capping layer 18 having a hydroxyl group-terminated end may be formed on a surface of each of the plurality of inorganic particles 16, thereby forming the plurality of organic-inorganic composite particles CP.

In an implementation, the process of forming the plurality of organic-inorganic composite particles CP may include a process of mixing the plurality of inorganic particles 16 with an organic silane compound in an aqueous phase.

The organic silane compound may include, e.g., a trialkoxysilane compound, a dialkoxysilane compound, or a bis-type trialkoxysilane compound.

In an implementation, the trialkoxysilane compound may include, e.g., 3-mercaptopropyltrimethoxysilane, 3-mercaptopropyltriethoxysilane, (3-acryloxypropyl)trimethoxysilane, 3-aminopropyltriethoxysilane, 3-aminopropyltrimethoxysilane, 3-glycidoxypropyltrimethoxysilane, 3-isocyanatopropyltriethoxysilane, 3-methacryloxypropyltrimethoxysilane, methyltriethoxysilane, methyltrimethoxysilane, or vinyltriethoxysilane.

In an implementation, the dialkoxysilane compound may include, e.g., 3-mercaptopropylmethyldiethoxysilane, (3-acryloxypropyl)methyldimethoxysilane, (3-aminopropyl)methyldiethoxysilane, dimethyldiethoxysilane, 3-glycidoxypropylmethyldimethoxysilane, 3-isocyanatopropylmethyldiethoxysilane, methacryloxymethyldiethoxysilane, 3-methacryloxypropylmethyldimethoxysilane, or vinylmethyldiethoxysilane.

In an implementation, the bis-type trialkoxysilane compound may include, e.g., bis-[3-(triethoxysilyl)propyl]tetrasulfide, bis-[3-(triethoxysilyl)propyl]amine, or bis-[3-(triethoxysilyl)propyl]ethane.

In an implementation, to form the plurality of organic-inorganic composite particles CP according to the process 30B, first, 3-mercaptopropyltrimethoxysilane (referred to as "MPTMS" hereinafter) may be added into a solution in which the plurality of inorganic particles 16 is dispersed. In an implementation, the solution in which the plurality of inorganic particles 16 is dispersed may include deionized water. Next, the plurality of organic-inorganic composite particles CP may be formed by stirring the MPTMS-added solution and then be separated from the stirred solution.

In a process 30C of FIG. 4, the plurality of organic-inorganic composite particles CP may be dispersed in a solvent, thereby forming an organic-inorganic composite particle-dispersed solution.

In an implementation, the solvent may include an organic solvent. In an implementation, the organic solvent may include, e.g., 1-methyl-2-pyrrolidinone (NMP), dimethylformamide (DMF), dimethylacetamide (DMAc), γ-butyrolactone (GBL), or dimethyl sulfoxide (DMSO). These organic solvents may be used alone or in combination.

In a process 30D of FIG. 4, a liquid mixture of a polymer precursor composition with the organic-inorganic composite particle-dispersed solution obtained in the process 30C may be formed.

The polymer precursor composition may include, e.g., a polyamic acid and an organic solvent.

In an implementation, the polyamic acid may be present in an amount of, e.g., about 20 wt % to about 90 wt % in the polymer precursor composition based on the total weight of the polymer precursor composition.

In an implementation, the polyamic acid may have a weight average molecular weight of, e.g., about 5,000 to about 200,000. In an implementation, the organic solvent included in the polymer precursor composition may include, e.g., NMP, DMF, DMAc, GBL, or DMSO.

In an implementation, the polymer precursor composition may further include a photoacid generator (PAG). In this case, the hybrid composite film 10 obtained as a final product may have positive-type photosensitivity. The PAG may include triarylsulfonium salts, diaryliodonium salts, sulfonates, or combinations thereof. The PAG may be present in an amount of about 1 wt % to about 20 wt % based on the total weight of the polymer precursor composition.

In an implementation, the hybrid composite film 10 obtained as a final product may have negative-type photosensitivity. In this case, the polymer precursor composition may not include the PAG. When the hybrid composite film 10 obtained as a final product has negative-type photosensitivity, the polyamic acid may include a group having an unsaturated double bond, such as an ethyl methacrylate, ethyl acrylate, propyl methacrylate, propyl acrylate, ethyl methacrylamide, propyl methacrylamide, ethyl acrylamide, propyl acrylamide group, or the like.

In an implementation, to impart negative-type photosensitivity to the hybrid composite film 10 obtained as a final product, the polymer precursor composition may further include a photopolymerizable compound. In an implementation, the photopolymerizable compound may include, e.g., 2-hydroxyethyl methacrylate, trimethylolpropane trimethacrylate, trimethylolpropane triacrylate, ethylene glycol dimethacrylate, diethylene glycol dimethacrylate, triethylene glycol dimethacrylate, tetraethylene glycol dimethacrylate, propylene glycol dimethacrylate, methylenebismethacrylamide, methylenebisacrylamide, or the like.

In an implementation, the polymer precursor composition may further include a surfactant, a thermal crosslinking agent, a curing accelerator, a photocrosslinking sensitizer, a phosphorus flame retardant, an antifoaming agent, a leveling agent, an antigelling agent, or a combination thereof.

In a process 30E of FIG. 4, a coating film may be formed from the liquid mixture formed in the process 30D.

In an implementation, to form the coating film, the liquid mixture formed in the process 30D may be coated on a supporter. In an implementation, the supporter may include a wafer. In an implementation, the supporter may include an intermediate product of an integrated circuit device. The intermediate product of the integrated circuit device may include a semiconductor device or a semiconductor package.

In an implementation, to form the coating film, spray coating, roll coating, rotation coating, slit coating, extrusion coating, curtain coating, die coating, wire bar coating, or knife coating may be used.

In a process 30F of FIG. 4, the coating film formed in the process 30E may be cured, thereby forming the hybrid composite film 10 shown in FIG. 1.

To cure the coating film, a thermal curing or photocuring process may be used. In an implementation, a temperature and time for curing the coating film may be variously selected according to kinds and amounts of components included in the polymer precursor composition. In an implementation, the process of curing the coating film may be performed at a temperature of about 60° C. to about 400° C. for about 30 seconds to about 3 hours.

In the method of fabricating the hybrid composite film 10 of an embodiment, the hybrid composite film 10 having relatively low coefficient of thermal expansion and relatively high thermal conductivity may be easily formed in a simple and economical manner.

Figure 5:
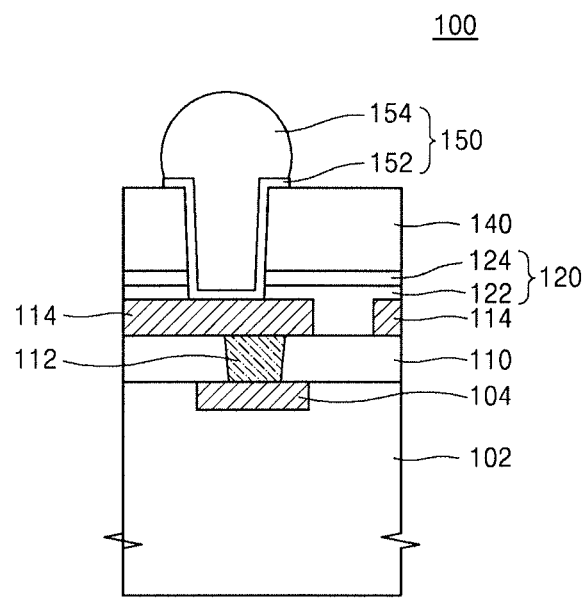
FIG. 5 illustrates a schematic cross-sectional view of an integrated circuit device, according to an embodiment.

FIG. 5 illustrates a schematic cross-sectional view of an integrated circuit device 100, according to embodiments.

The integrated circuit device 100 may include, e.g., a semiconductor device 102; a plurality of conductive lines 114 connected to a conductive region 104 of the semiconductor device 102; a passivation film 120 covering the plurality of conductive lines 114; a hybrid composite film 140 covering the plurality of conductive lines 114, with the passivation film 120 being therebetween.

The semiconductor device 102 may include a semiconductor wafer and a circuit unit including individual unit devices arranged on the semiconductor wafer and configured to perform various circuit functions, and the conductive region 104 may be a portion of the circuit unit. The semiconductor device 102 may include a transistor, a resistor, a capacitor, a plurality of wiring lines, and insulating films providing insulation therebetween. For example, the semiconductor device 102 may include a memory device, a logic device such as a microcontroller, an analog device, a digital signal processor device, a system-on-chip device, or a combination thereof. The memory device may include dynamic random access memory (DRAM), magnetic RAM (MRAM), static RAM (SRAM), phase change RAM (PRAM), resistance RAM (RRAM), ferroelectric RAM (FRAM), or a combination thereof.

An interlayer dielectric 110 may be arranged between the conductive region 104 and the plurality of conductive lines 114, and at least some of the plurality of conductive lines 114 may be connected to the conductive region 104 of the semiconductor device 102 via a contact plug 112 penetrating the interlayer dielectric 110. In some embodiments, the plurality of conductive lines 114 may function as pads electrically connecting a circuit included in the semiconductor device 102 to a device external to the integrated circuit device 100.

In an implementation, the interlayer dielectric 110 may include, e.g., a silicon oxide film. Each of the contact plug 112 and the plurality of conductive lines 114 may include a metal, a conductive metal nitride, or a combination thereof. In an implementation, each of the contact plug 112 and the plurality of conductive lines 114 may include Cu, Ti, TiW, TiN, or a combination thereof.

The passivation film 120 may include a first insulating film 122 and a second insulating film 124. In an implementation, the first insulating film 122 may include a silicon oxide film, and the second insulating film 124 may include a silicon nitride film. In an implementation, the passivation film 120 may have a double layer structure. In an implementation, the passivation film 120 may include a single or multiple layer including a silicon oxide film, a silicon nitride film, or a combination thereof. In an implementation, the passivation film 120 may be omitted.

The hybrid composite film 140 may have the same configuration as the hybrid composite film 10 described with reference to FIG. 1.

The integrated circuit device 100 may include a connection structure 150 connected to a conductive line 114 through the passivation film 120 and the hybrid composite film 140. The connection structure 150 may include a first conductive layer 152 connected to the conductive line 114 and a connection terminal 154 connected to the first conductive layer 152. The first conductive layer 152 may include Cr, W, Ti, Cu, Ni, Al, Pd, Au, or a combination thereof. The connection terminal 154 may include a solder bump or a solder ball.

The integrated circuit device 100 may include the hybrid composite film 140 having a relatively low coefficient of thermal expansion and relatively high thermal conductivity, whereby the integrated circuit device 100 may solve defects such as interface cracking, peeling-off, or the like due to a difference in coefficient of thermal expansion and may have improved reliability.

FIGS. 6A to 6D illustrate cross-sectional views of stages in a method of fabricating an integrated circuit device, according to embodiments. An example method of fabricating the integrated circuit device 100 shown in FIG. 5 will be described with reference to FIGS. 6A to 6D.

Figure 6A:
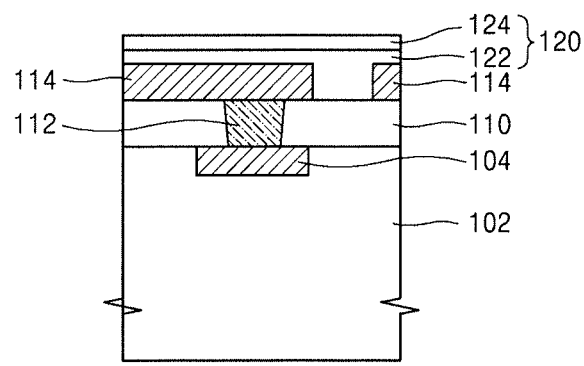
FIGS. 6A to 6D illustrate cross-sectional views of stages in a method of fabricating an integrated circuit device, according to an embodiment.

Referring to FIG. 6A, the interlayer dielectric 110, the contact plug 112 connected to conductive region 104 through the interlayer dielectric 110, and the plurality of conductive lines 114 are formed over the semiconductor device 102 including the conductive region 104, followed by forming the passivation film 120, which covers the interlayer dielectric 110 and the plurality of conductive lines 114. In some embodiments, the process of forming the passivation film 120 may be omitted.

Figure 6B:
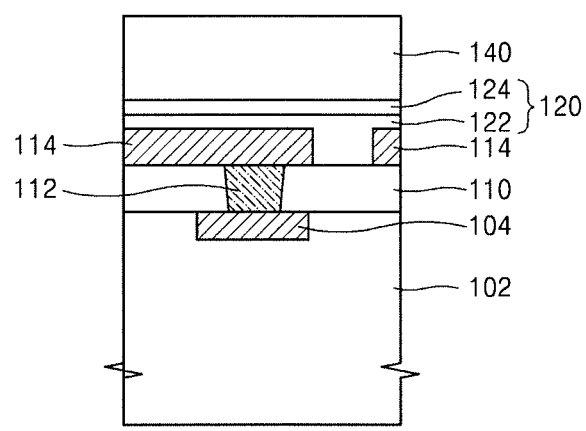

Referring to FIG. 6B, the hybrid composite film 140 may be formed on the passivation film 120.

To form the hybrid composite film 140, the same method as the method of forming the hybrid composite film 10, which has been described with reference to FIG. 4, may be used.

Figure 6C:
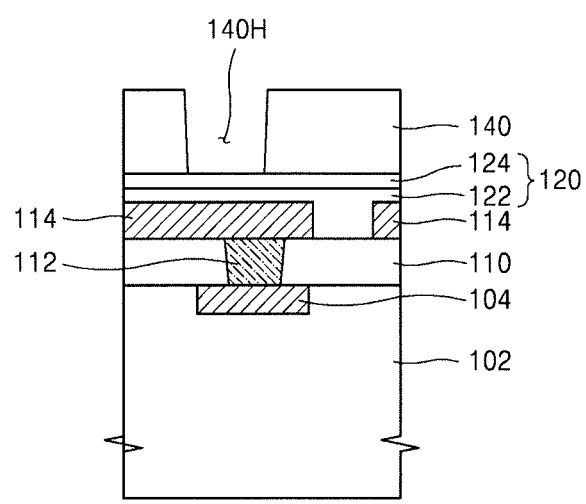

Referring to FIG. 6C, the hybrid composite film 140 may be patterned by a photolithography process, thereby forming a hole 140H in the hybrid composite film 140, the hole 140H exposing the passivation film 120.

Figure 6D:
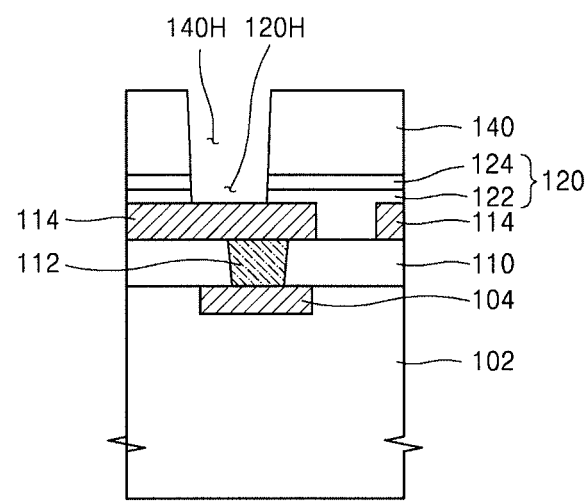

Referring to FIG. 6D, the passivation film 120 may be anisotropically etched by using, as an etch mask, the hybrid composite film 140 in which the hole 140H is formed, thereby forming a hole 120H in the passivation film 120, the hole 120H exposing the conductive line 114.

Next, the first conductive layer 152 connected to the conductive line 114 through the hole 120H, and the connection terminal 154 may be formed, thereby forming the integrated circuit device 100 shown in FIG. 5.

When the process of forming the passivation film 120 is omitted from the process of FIG. 6A, the process of anisotropically etching the passivation film 120 may also be omitted, and in this case, the first conductive layer 152 connected to the conductive line 114, and the connection terminal 154 may be formed in the hole 140H formed in the hybrid composite film 140.

Figure 7:
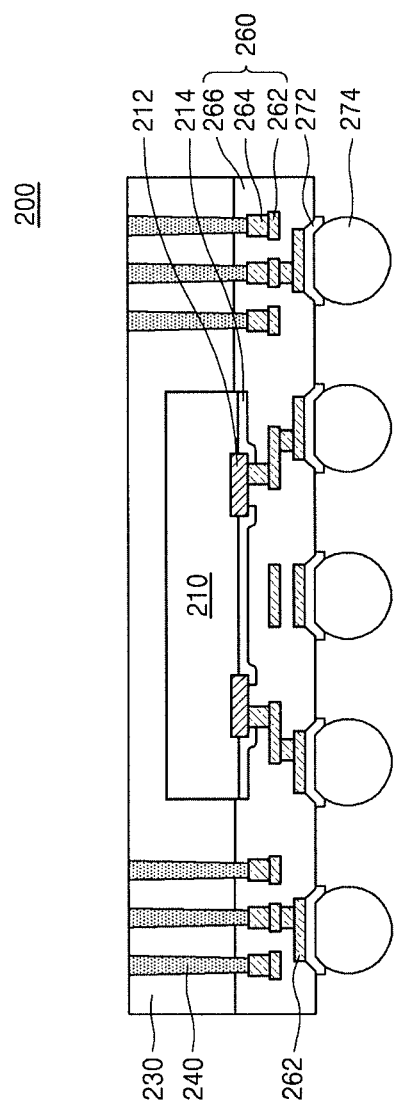
FIG. 7 illustrates a schematic cross-sectional view of an integrated circuit device, according to an embodiment.

FIG. 7 illustrates a schematic cross-sectional view of an integrated circuit device 200, according to other embodiments.

Referring to FIG. 7, the integrated circuit device 200 may include a semiconductor chip package. The integrated circuit device 200 may include a semiconductor chip 210 and a redistribution layer 260 facing the semiconductor chip 210.

The semiconductor chip 210 may include a memory chip or a logic chip. The semiconductor chip 210 may include a conductive pad 212. In an implementation, one surface of the semiconductor chip 210 may be covered with a chip protective film 214, and the conductive pad 212 may be exposed outside the semiconductor chip 210 by the chip protective film 214.

The chip protective film 214 may include the hybrid composite film according to an embodiment. The hybrid composite film included in the chip protective film 214 may have the same configuration as the hybrid composite film 10 described with reference to FIG. 1. In an implementation, the chip protective film 214 may include the hybrid composite film 10 described with reference to FIG. 1 and an inorganic insulating film. The inorganic insulating film may include a silicon oxide film, a silicon nitride film, or a combination thereof.

A top surface and sidewalls of the semiconductor chip 210 may be covered with a molding unit 230. A plurality of connection vias 240 may extend to the redistribution layer 260 through the molding unit 230. The connection vias 240 may be arranged apart from the semiconductor chip 210. The molding unit 230 may include an insulating material such as an epoxy molding compound (EMC) or the like.

The redistribution layer 260 may include a plurality of redistribution patterns 262, a plurality of redistribution plugs 264, and a redistribution insulating layer 266.

The redistribution insulating layer 266 may include the hybrid composite film according to an embodiment. The hybrid composite film included in the redistribution insulating layer 266 may have the same configuration as the hybrid composite film 10 described with reference to FIG. 1. In an implementation, the redistribution insulating layer 266 may include the hybrid composite film and an inorganic insulating film. The inorganic insulating film may include a silicon oxide film, a silicon nitride film, or a combination thereof.

Some of the plurality of redistribution plugs 264 may be respectively connected to conductive pads 212, and some others may be respectively connected to the connection vias 240. A redistribution pattern 262 may be electrically connected to the conductive pad 212 or a connection via 240 via a redistribution plug 264. In an implementation, each of the redistribution patterns 262 and the redistribution plugs 264 may include, e.g., Cu, Al, W, Ni, Ti, TiN, Ta, TaN, Au, or a combination thereof.

An under bump metal (UBM) layer 272 may be formed on the redistribution layer 260. The UBM layer 272 may be connected to the redistribution pattern 262 or the redistribution plug 264. The UBM layer 272 may include Cr, W, Ti, Cu, Ni, Al, Pd, Au, or a combination thereof. A connection terminal 274 for connection to a device external to the integrated circuit device 200 may be arranged on the UBM layer 272. The connection terminal 274 may include a solder bump or a solder ball.

The integrated circuit device 200 may include the chip protective film 214 and/or the redistribution insulating layer 266, which include the hybrid composite film having a relatively low coefficient of thermal expansion and relatively high thermal conductivity. Therefore, the integrated circuit device 200 may help compensate for or otherwise reduce or prevent interface cracking, peeling-off, or the like caused by a difference in coefficient of thermal expansion and may have improved reliability.

FIGS. 8A to 8E illustrate cross-sectional views of stages in a method of fabricating an integrated circuit device, according to other embodiments. An example method of fabricating the integrated circuit device 200 shown in FIG. 7 will be described with reference to FIGS. 8A to 8E.

Figure 8A:
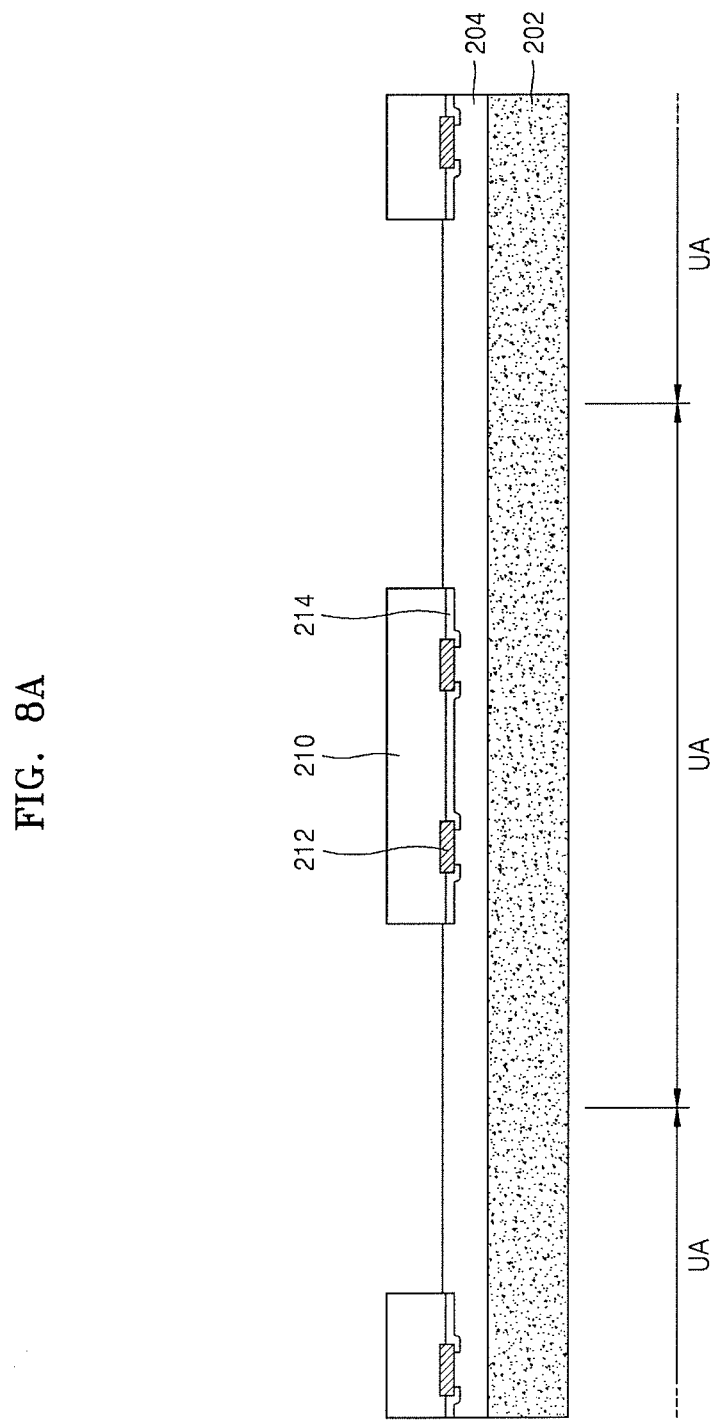
FIGS. 8A to 8E illustrate cross-sectional views of stages in a method of fabricating an integrated circuit device, according to an embodiment.

Referring to FIG. 8A, a stack structure including a first carrier substrate 202 and a first adhesive layer 204 may be prepared. The first carrier substrate 202 may include a plurality of unit areas UA. Each of the plurality of unit areas UA may be an area for mounting one semiconductor chip 210. The first adhesive layer 204 may include a photothermal conversion material converting light energy due to laser irradiation into thermal energy. In an implementation, the first adhesive layer 204 may include an organic material containing a laser absorbing material. In an implementation, the first adhesive layer 204 may include a thermoplastic material such as an acrylic resin or the like, or a UV sensitive material.

A plurality of semiconductor chips 210 may be attached onto the first adhesive layer 204. Each of the plurality of semiconductor chips 210 may include a plurality of conductive pads 212, and one surface of each semiconductor chip 210 may be covered with the chip protective film 214. The conductive pads 212 may be exposed outside each semiconductor chip 210 by the chip protective film 214. The conductive pads 212 and the chip protective film 214 may directly contact the first adhesive layer 204.

Figure 8B:
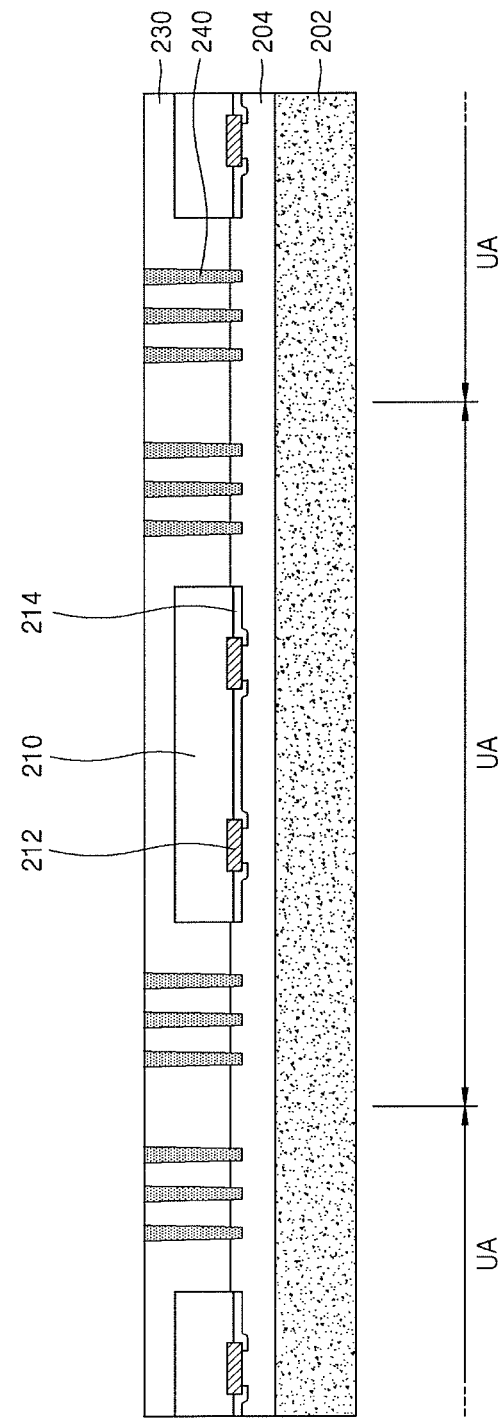

Referring to FIG. 8B, the molding unit 230 may be formed on the first adhesive layer 204 to cover the plurality of semiconductor chips 210, and the plurality of connection vias 240 may be formed through the molding unit 230.

Figure 8C:
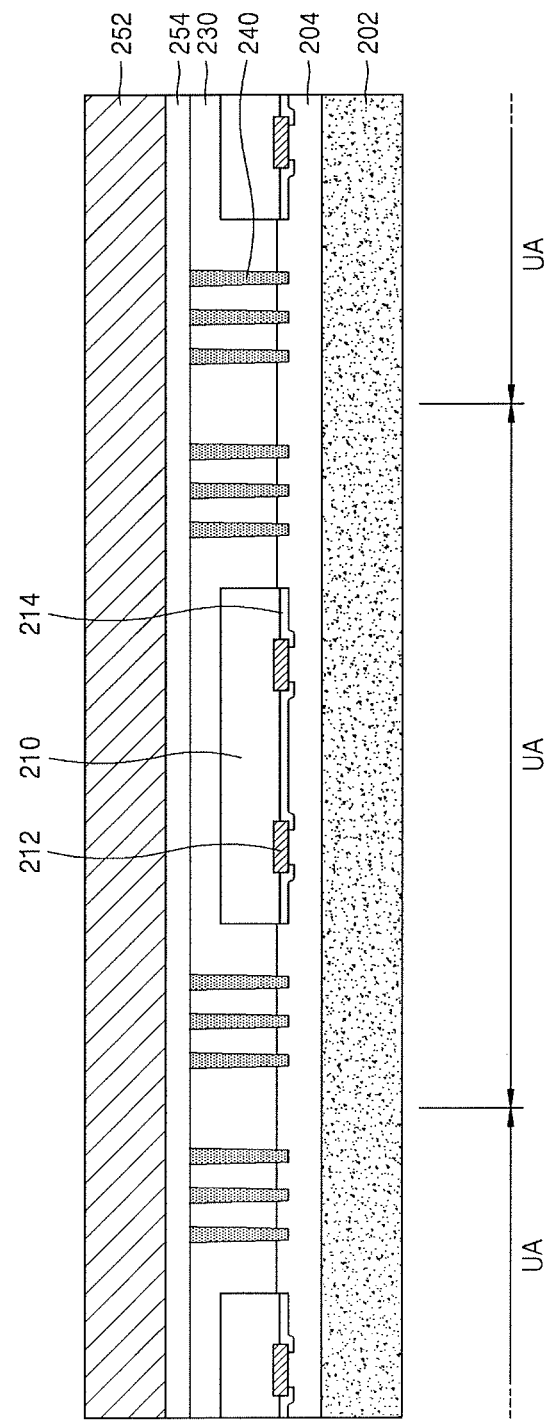

Referring to FIG. 8C, a second carrier substrate 252 may be attached onto the molding unit 230. The second carrier substrate 252 may be attached onto the molding unit 230 by using a second adhesive layer 254. The first carrier substrate 202 and the second carrier substrate 252 may face each other with the molding unit 230 therebetween. The second carrier substrate 252 and the second adhesive layer 254 may respectively have the same configurations as the first carrier substrate 202 and the first adhesive layer 204, which have been described with reference to FIG. 8A.

Figure 8D:
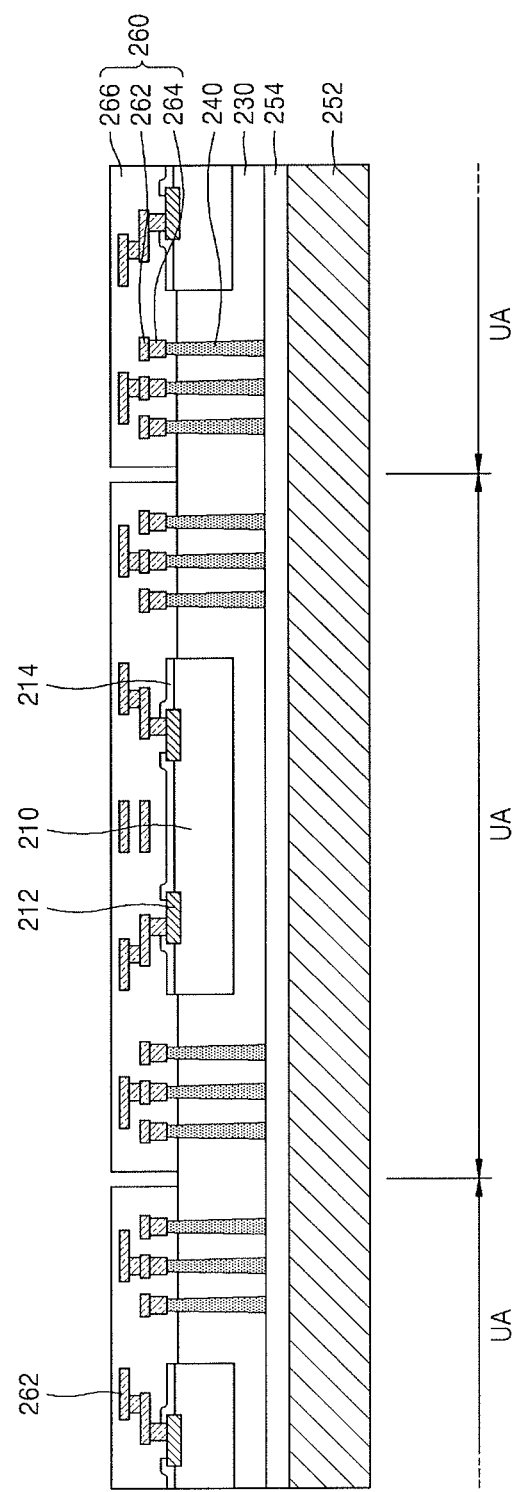

Referring to FIG. 8D, the first carrier substrate 202 and the first adhesive layer 204 may be removed from a result product of FIG. 8C.

In an implementation, when the first adhesive layer 204 includes an organic material containing a laser absorbing material, to remove the first carrier substrate 202 and the first adhesive layer 204, the first adhesive layer 204 may be partially melted by irradiating the result product of FIG. 8C with a laser, followed by separating the first adhesive layer 204 from the molding unit 230 and the semiconductor chips 210. In an implementation, to remove the first carrier substrate 202 and the first adhesive layer 204, an upper portion of the first carrier substrate 202 may be irradiated with UV or be heated. In some embodiments, a result product of FIG. 8D obtained by removing the first carrier substrate 202 may be cleaned.

After the first carrier substrate 202 and the first adhesive layer 204 are removed, the molding unit 230, one end of each of the plurality of connection vias 240, the conductive pads 212 of each semiconductor chip 210, and the chip protective film 214 may be exposed.

Next, the redistribution layer 260 is formed to cover the molding unit 230, the one end of each of the plurality of connection vias 240, the conductive pads 212 of each semiconductor chip 210, and the chip protective film 214.

In an example process of forming the redistribution layer 260, a process of forming the hybrid composite film according to an embodiment on the molding unit 230, the semiconductor chips 210, and the connection vias 240, followed by forming a plurality of holes in the hybrid composite film, and then forming conductive patterns to fill the plurality of holes may be performed at least once. In forming the redistribution layer 260, to form the hybrid composite film, the method of forming the hybrid composite film, which has been described with reference to FIG. 4, may be used.

Figure 8E:
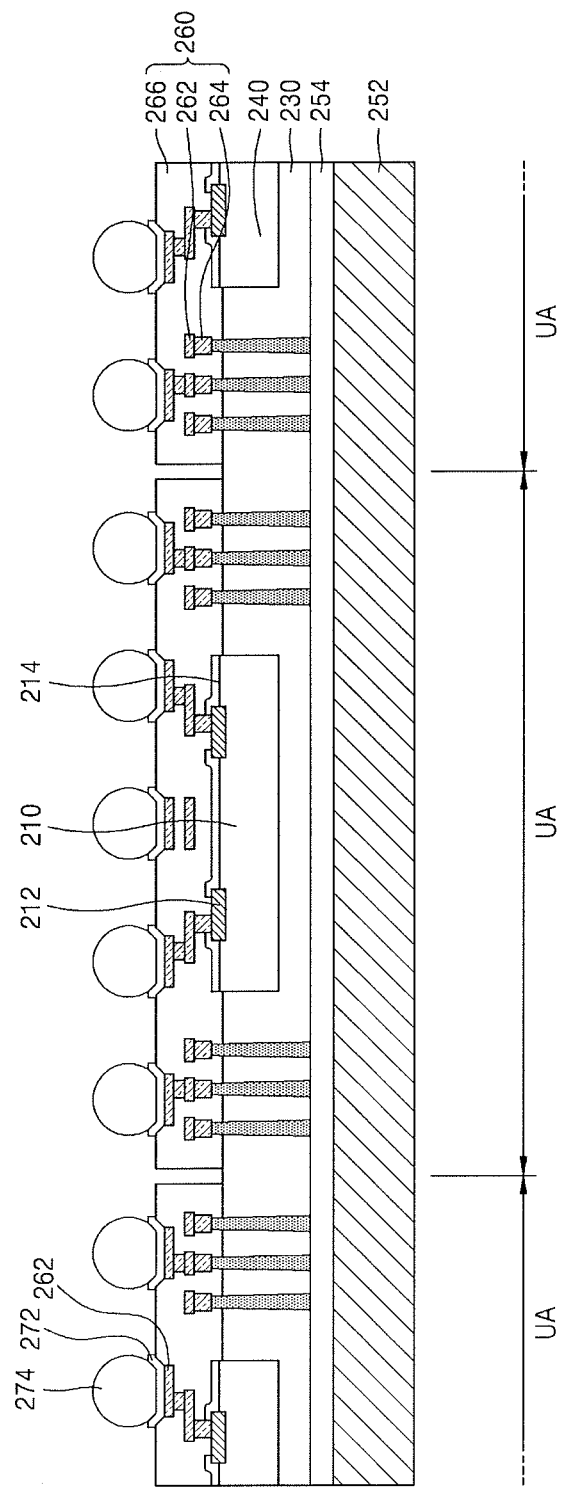

Referring to FIG. 8E, some of the redistribution patterns 262 may be exposed by partially removing the redistribution insulating layer 266 (including the hybrid composite film according to an embodiment), the UBM layer 272 may be formed on each of the exposed redistribution patterns 262, and then, the connection terminal 274 may be formed on the UBM layer 272.

Next, a result product of FIG. 8E including the connection terminal 274 may be separated into the individual unit areas UA, thereby fabricating the integrated circuit device 200 shown in FIG. 7. Next, the second carrier substrate 252 and the second adhesive layer 254 may be removed from the integrated circuit device 200.

In an implementation, the hybrid composite film according to an embodiment may be applied as a component of various integrated circuit devices such as semiconductor devices, display devices, and the like.

Next, various examples for fabricating and evaluating the hybrid composite film according to embodiments will be described.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

First, materials and apparatuses used in examples described herein are as follows.

Zinc sulfate monohydrate ($ZnSO_4 \cdot H_2O$, 99.9%, powder), sodium sulfide nonahydrate ($Na_2S \cdot 9H_2O$, 98%), tetraethylorthosilicate (TEOS), zirconium oxychloride octahydrate ($ZrOCl_2 \cdot 8H_2O$, 99.5%), ammonium metatungstate hydrate (($NH_4)_6H_2W_{12}O_{40} \cdot xH_2O$, 99.99%), ammonium hydroxide ($NH_4OH$, 5 M), ethylenediaminetetraacetic acid (EDTA, 99.95%, powder), 3-mercaptopropyltrimethoxysilane (MPTMS, 95%), 1-methyl-2-pyrrolidinone (NMP, 99.5%), 4,4'-oxydianilline (ODA, 97%, powder), and pyromellitic dianhydride (PMDA, 97%, powder) were purchased from Sigma-Aldrich Co., Ltd., and hydrochloric acid (HCl, 35%) and ethanol were purchased from Duksan Co., Ltd. The purchased chemicals were used as they were without additional purification. Deionized (DI) water from the Millipore water (18 MΩ·cm) purification system was used.

Preparation Example 1

Synthesis of ZnS Particles 10 mL of a 0.4 M $ZnSO_4$ solution and 10 mL of a 0.1 M EDTA solution were added to 26 mL of DI water, followed by mixing the components by stirring at ambient temperature for 2 hours, and then, the mixture was subjected to dropwise addition of 10 mL of a 0.5 M $Na_2S$ solution and stirring at ambient temperature for 24 hours, thereby obtaining ZnS particles. The obtained ZnS particles were redispersed in ethanol and centrifuged several times, thereby obtaining a final product of the ZnS particles.

Preparation Example 2

Synthesis of Organic-Inorganic Composite Particles Including ZnS Particles 10 mL of a 0.4 M $ZnSO_4$ solution and 10 mL of a 0.1 M EDTA solution were added to 26 mL of DI water, followed by mixing the components by stirring at ambient temperature for 2 hours, and then, 10 mL of a 0.5 M $Na_2S \cdot 9H_2O$ solution was added dropwise to the mixture. After 2 hours, 15 µl of MPTMS was added to the mixture for surface treatment, followed by stirring the mixture at ambient temperature for 20 hours, thereby obtaining organic-inorganic composite particles including ZnS particles surface-modified with (e.g., having an organic capping layer formed of) MPTMS. The obtained organic-inorganic composite particles were centrifuged several times and then redispersed in ethanol, thereby obtaining a final product of the organic-inorganic composite particles (referred to as "ZnS-MPTMS particles" hereinafter).

Preparation Example 3

Synthesis of PMDA-ODA Polyamic Acid Solution

A PMDA-ODA-based polyamic acid was synthesized in the following manner.

0.01 mol of ODA and 36.6 mL of an NMP solvent were introduced into a 100 mL flask and stirred at ambient temperature, followed by adding 0.01 mol of PDMA to the solution directly after complete dissolution of ODA, and then, the solution was stirred at ambient temperature for 24 hours, thereby synthesizing a polyamic acid. Here, an amount of a polymer in the resulting solution was adjusted to 10 wt %.

Preparation Example 4

Synthesis of Silica Particles

Silica particles were synthesized by the Stober method. Specifically, 2.68 mL of TEOS, 8.4 mL of DI water, and 1.44 mL of $NH_4OH$ were mixed with 7.78 mL of ethanol, followed by stirring the components at ambient temperature for 24 hours. The obtained silica particles were washed by several cycles of centrifugation and redispersion in NMP using a rotary evaporator.

Preparation Example 5

Synthesis of Zirconium Tungstate Particles

Zirconium tungstate was synthesized by a hydrothermal route. Specifically, 806 mg of $ZrOCl_2 \cdot 8H_2O$ and 1325 mg of $(NH_4)_6H_2W_{12}O_0 \cdot xH_2O$ were respectively dissolved in 10 mL of DI water and 20 mL of DI water, followed by slowly adding the two resulting solutions to 10 mL of DI water under magnetic stirring. After stirring for 30 minutes, 10 mL of a 12 M HCl solution was added to the resulting mixture. After 1 hour, the resulting homogeneous solution was heated at 180° C. for 24 hours. The resulting white precipitates, $ZrW_2O_7(OH)_2 \cdot 2H_2O$, were washed by several cycles of centrifugation at 8000 rpm and redispersion in DI water. The $ZrW_2O_7(OH)_2 \cdot 2H_2O$ was calcined at 630° C. for 30 minutes and redispersed in NMP by using a rotary evaporator, thereby obtaining $ZrW_2O_8$ particles.

EXAMPLE 1

Preparation of Hybrid Composite Film Including Polyimide in which ZnS Particles are Dispersed The ZnS particles obtained in Preparation Example 1 were redispersed in an NMP solvent by using a rotary evaporator, followed by stirring the components, for 12 hours, together with the polyamic acid obtained in Preparation Example 3 according to a target amount of the ZnS particles. In the present example, the amount of the ZnS particles was variously selected from a range of 1 wt % to 25 wt % based on the total amount of the ZnS particles and the polyamic acid.

After the stirring, the prepared solution was coated on a substrate and then cured, thereby preparing a hybrid composite film including a polyimide in which the ZnS particles were dispersed. In the curing set forth above, curing at 100° C. for 1 hour, curing at 200° C. for 1 hour, and curing at 300° C. for 1 hour were sequentially performed.

EXAMPLE 2

Preparation of Hybrid Composite Film Including Polyimide in which ZnS Particles are Dispersed In a similar manner to that in Example 1, the ZnS-MPTMS particles obtained in Preparation Example 2 were redispersed in an NMP solvent by using a rotary evaporator, followed by stirring the components, for 12 hours, together with the polyamic acid obtained in Preparation Example 3 according to a target amount of the ZnS-MPTMS particles. In the present example, the amount of the ZnS-MPTMS particles was variously selected from a range of 1 wt % to 25 wt % based on the total amount of the ZnS-MPTMS particles and the polyamic acid. Here, in the ZnS-MPTMS particles, a weight of an MPTMS-based organic capping layer surrounding each ZnS particle with respect to the total weight of the ZnS-MPTMS particles was negligible.

After the stirring, the prepared solution was coated on a substrate and then cured, thereby preparing a hybrid composite film including a polyimide in which the ZnS-MPTMS particles were dispersed. In the curing set forth above, curing at 100° C. for 1 hour, curing at 200° C. for 1 hour, and curing at 300° C. for 1 hour were sequentially performed.

EXAMPLE 3

Preparation of Hybrid Composite Film Including Polyimide in which Silica Particles are Dispersed The silica particles obtained in Preparation Example 4 and the polyamic acid obtained in Preparation Example 3 were homogeneously mixed at ambient temperature under magnetic stirring. The resulting mixture was coated on a silicon wafer, followed by drying the mixture in ambient conditions for 24 hours, and then cured to convert the polyamic acid into a polyimide, thereby preparing a hybrid composite film including the polyimide in which the silica particles were dispersed. In the curing set forth above, curing at 100° C. for 1 hour, curing at 200° C. for 1 hour, and curing at 300° C. for 1 hour were sequentially performed.

EXAMPLE 4

Preparation of Hybrid Composite Film Including Polyimide in which Zirconium Tungstate Particles are Dispersed A hybrid composite film including a polyimide in which zirconium tungstate particles were dispersed was prepared in the same manner as in Example 3 except that the zirconium tungstate particles obtained in Preparation Example 5 were used instead of the silica particles obtained in Preparation Example 4.

Comparative Example

Preparation of Polyimide Film

The polyamic acid obtained in Preparation Example 3 was coated on a substrate and then cured, thereby preparing a polyimide film (referred to as "PI film" hereinafter). In the curing set forth above, curing at 100° C. for 1 hour, curing at 200° C. for 1 hour, and curing at 300° C. for 1 hour were sequentially performed.

Evaluation Example 1

XRD Analysis of ZnS Particles

Figure 9:
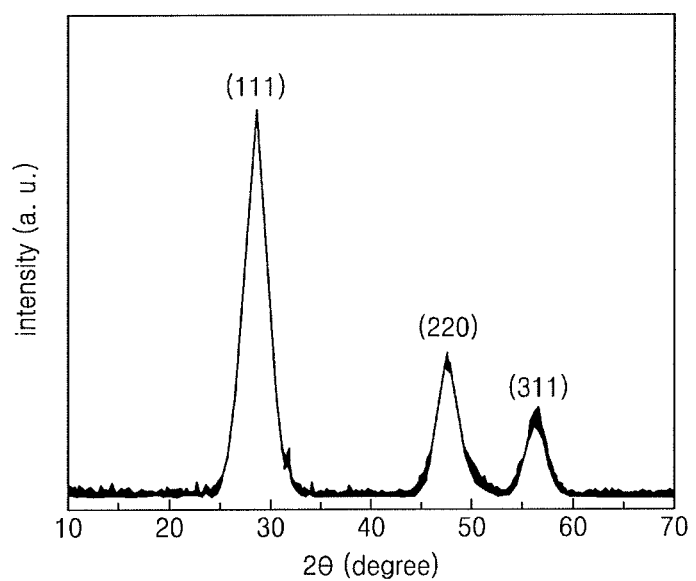
FIG. 9 illustrates a graph depicting results of X-ray diffraction analysis of ZnS particles obtained in Preparation Example 1.

FIG. 9 illustrates a graph depicting results of X-ray diffraction (XRD) analysis of the ZnS particles obtained in Preparation Example 1.

In FIG. 9, it may be seen that peaks respectively appeared at 2θ values of 28°, 48°, and 57°. These peaks respectively represent (111), (220), and (311) planes. It can be understood from the results of FIG. 9 that the ZnS particles obtained in Preparation Example 1 had zinc blende (ZB) structures.

In addition, as a result of calculating an average size of unit crystals by using locations of the peaks and the Debye-Scherrer formula, it was seen that the ZnS particles obtained in Preparation Example 1 had an average unit crystal size of about 1 nm to about 3 nm.

Evaluation Example 2

TEM Analysis of ZnS Particles

Figure 10:
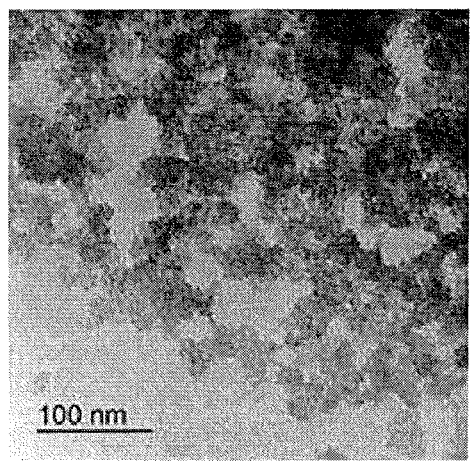
FIG. 10 illustrates an image showing results of transmission electron microscopy (TEM) analysis of ZnS particles obtained in Preparation Example 1.

FIG. 10 illustrates an image showing results of transmission electron microscopy (TEM) analysis of the ZnS particles obtained in Preparation Example 1.

Referring to FIG. 10, although the ZnS particles were synthesized to a small size in the order of a few nanometers as calculated through the XRD analysis of Evaluation Example 1, it can be seen that a plurality of ZnS particles were agglomerated.

Evaluation Example 3

Zeta-Potential Analysis for Confirming Surface Modification or not of ZnS Particles To confirm surface modification or not of the ZnS-MPTMS particles obtained in Preparation Example 2, the ZnS particles obtained in Preparation Example 1 and the ZnS-MPTMS particles obtained in Preparation Example 2 were respectively analyzed as to zeta-potential. As a result, the zeta-potential of the ZnS particles obtained in Preparation Example 1 was measured as −5 mV, and the zeta-potential of the ZnS-MPTMS particles obtained in Preparation Example 2 was measured as −20 mV. It can be seen from these results that the ZnS-MPTMS particles were synthesized well.

Evaluation Example 4

SEM Analysis of Hybrid Composite Film

Properties of a composite film including a polyimide and inorganic particles may vary depending upon dispersion of the inorganic particles in the composite film. To analyze the dispersion of the inorganic particles in the composite film, surface and cross-section analysis was performed on each of the PI film of the Comparative Example and the hybrid composite films (amount of ZnS particles: 15 wt %) of Examples 1 and 2 by using scanning electron microscopy (SEM).

Figure 11A:
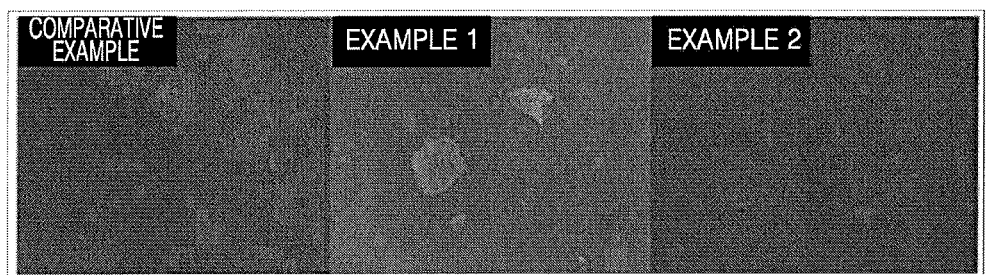
FIGS. 11A and 11B illustrate images showing results of SEM analysis of films obtained in the Comparative Example and Examples 1 and 2.
Figure 11B:
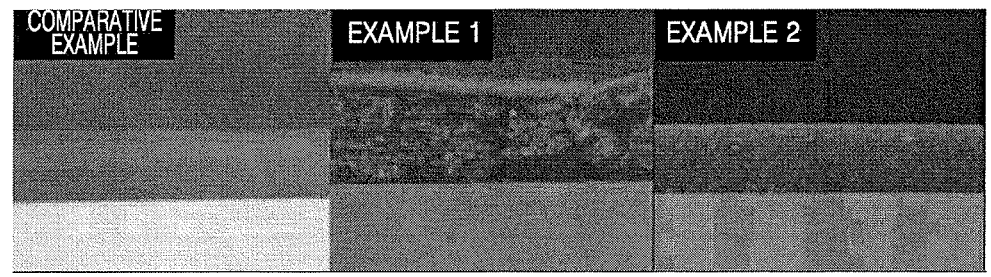

FIGS. 11A and 11B illustrate images of the respective films of the Comparative Example and Examples 1 and 2, the images being obtained by SEM analysis, and in particular, FIG. 11A shows surface images, and FIG. 11B shows cross-section images.

From the results of FIGS. 11A and 11B, the respective surfaces and cross-sections of the PI film of Comparative Example and the hybrid composite films of Examples 1 and 2 may be compared. In FIGS. 11A and 11B, from the results of the hybrid composite film of Example 2, it can be seen that the ZnS particles were dispersed well in the polyimide film without agglomeration unlike in the hybrid composite film of Example 1. From this result, it can be seen that the dispersion of the ZnS-MPTMS particles in the polyimide film was uniformly controlled, the ZnS-MPTMS particles being obtained by surface modification of the ZnS particles.

Evaluation Example 5

Analysis of Coefficient of Thermal Expansion of Hybrid Composite Film

Figure 12:
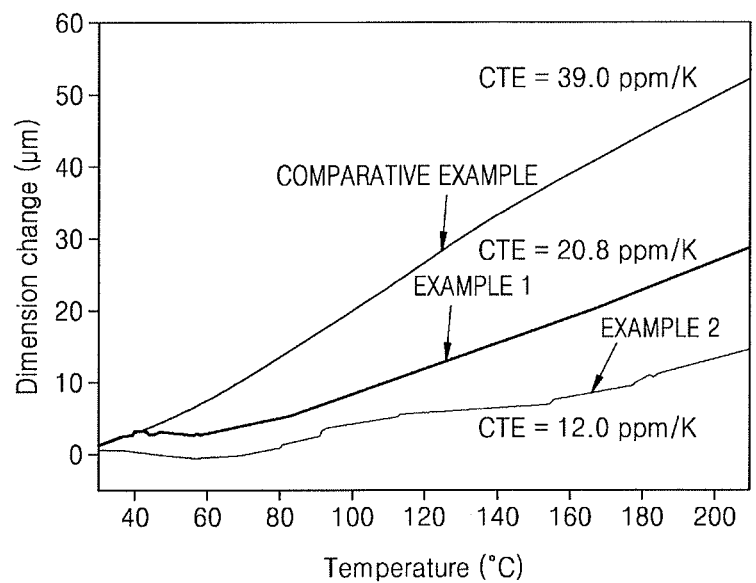
FIG. 12 illustrates a graph depicting measurement results of coefficients of thermal expansion (CTEs) of respective films obtained in the Comparative Example and Examples 1 and 2.

FIG. 12 illustrates a graph depicting results of coefficient of thermal expansion (CTE) measured on each of the PI film of Comparative Example and the hybrid composite films (amount of ZnS particles: 15 wt %) of Examples 1 and 2 at a temperature of 30° C. to 200° C.

Referring to FIG. 12, the PI film of Comparative Example had a CTE of 39.0 ppm/K, which was a much higher value than that of Cu capable of being included in a wiring layer of an integrated circuit device or that of Si capable of being included in an insulating layer of an integrated circuit device. On the other hand, the hybrid composite film of Example 2 had a CTE of 12.0 ppm/K, which was about 30% of the CTE of the PI film and thus significantly low.

Evaluation Example 6

Evaluation of Thermal Diffusivity of Hybrid Composite Film

Figure 13:
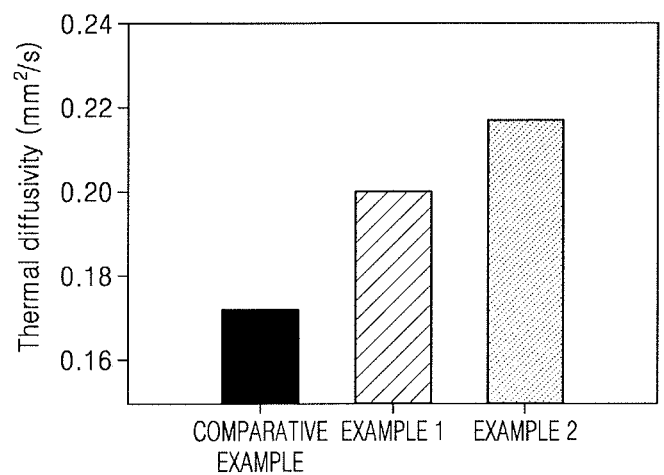
FIG. 13 illustrates a graph depicting measurement results of thermal diffusivity of respective films obtained in the Comparative Example and Examples 1 and 2.

FIG. 13 illustrates a graph depicting results of thermal diffusivity measured on each of the PI film of the Comparative Example and the hybrid composite films (amount of ZnS particles: 15 wt %) of Examples 1 and 2.

Referring to FIG. 13, while the PI film of the Comparative Example had a thermal diffusivity of 0.172 mm²/s, the hybrid composite film of Example 1 including the ZnS particles had a thermal diffusivity of 0.200 mm²/s, and the hybrid composite film of Example 2 including the ZnS-MPTMS particles had a thermal diffusivity of 0.217 mm²/s. For example, it was seen that the thermal diffusivity of the hybrid composite film of Example 1 was greater than that of the PI film, and that the thermal diffusivity of the hybrid composite film of Example 2 was greater than that of the hybrid composite film of Example 1. From the results of FIG. 13, it can be understood that, the ZnS-MPTMS particles obtained by surface modification of the ZnS particles exhibited improved dispersion within the polyimide film as compared with the ZnS particles, and the thermal diffusivity of the hybrid composite film including the ZnS-MPTMS particles was increased. Thus, it can be understood that the hybrid composite film including the ZnS-MPTMS particles exhibited improved heat dissipation capabilities and, as a result, had an influence on reducing the CTE thereof.

Evaluation Example 7

Evaluation of Mechanical Properties of Hybrid Composite Film

Figure 14A:
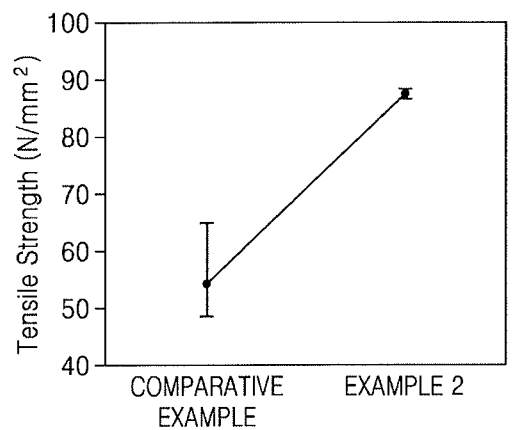
FIGS. 14A to 14C illustrate graphs depicting evaluation results of mechanical properties of films obtained in the Comparative Example and Examples 1 and 2, respectively.
Figure 14B:
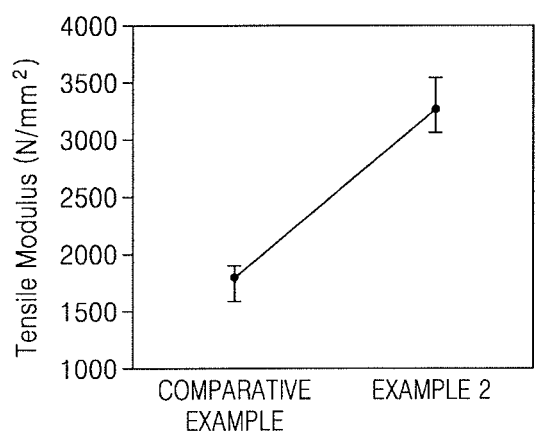
Figure 14C:
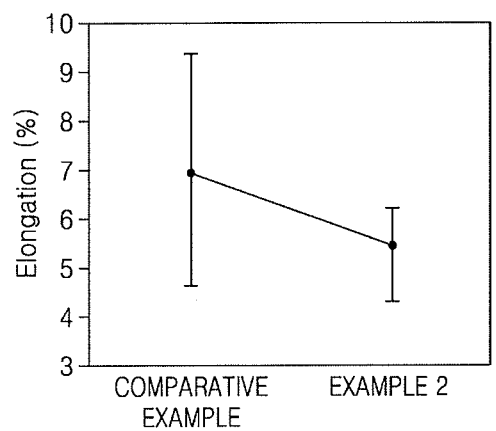

FIGS. 14A to 14C illustrate graphs respectively depicting results of mechanical properties evaluated for the PI film of the Comparative Example and the hybrid composite films (amount of ZnS particles: 15 wt %) of Examples 1 and 2. For example, FIG. 14A shows evaluation results of tensile strength, FIG. 14B shows evaluation results of tensile modulus, and FIG. 14C shows evaluation results of elongation.

Referring to FIGS. 14A to 14C, the hybrid composite film of Example 2 including the ZnS-MPTMS particles had a tensile strength increased about 1.6-fold, a tensile modulus increased about 1.8-fold, and an elongation reduced by about 20%, as compared with the PI film. In addition, it was seen that the hybrid composite film of Example 2 had less errors (error bars) in mechanical properties than the PI film of the Comparative Example. From the evaluation results of the mechanical properties of FIGS. 14A to 14C, it can be seen that the dispersion of the inorganic particles of the hybrid composite film of Example 2 was uniformly controlled.

Evaluation Example 8

Evaluation of Transmittance of Hybrid Composite Film

Figure 15:
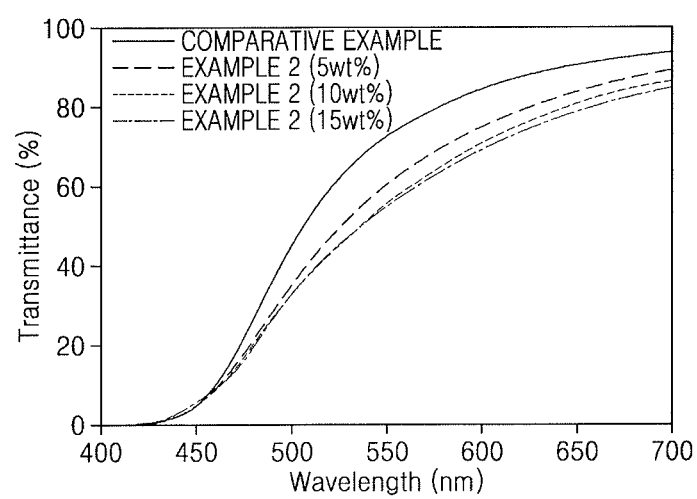
FIG. 15 illustrates a graph depicting analysis results of transmittance of respective films obtained in the Comparative Example and Example 2.

FIG. 15 illustrates a graph depicting results of transmittance analyzed for each of the PI film of Comparative Example and the hybrid composite films (amount of ZnS particles: 5 wt %, 10 wt %, and 15 wt %) of Example 2 including the ZnS-MPTMS particles.

Generally, if uniform dispersion of inorganic particles within a polymer film is not secured, the transmittance of a hybrid composite film may be reduced due to light scattering. In FIG. 15, it can be seen that, even though the amount of the ZnS particles was increased, the hybrid composite films of Example 2 exhibited a low reduction in transmittance from the transmittance of the PI film of the Comparative Example. From the results of FIG. 15, it can be seen that the ZnS particles in the hybrid composite films of Example 2 were maintained in a uniformly dispersed arrangement, without agglomeration. Therefore, it can be understood that the hybrid composite films of Example 2 could secure transmittance and thus be applied to a photolithography process for a process of fabricating an integrated circuit device.

Evaluation Example 9

Evaluation of Size and Morphology of Particles

To evaluate the size of each of the ZnS particles obtained in Preparation Example 1, the silica ($SiO_2$) particles obtained in Preparation Example 4, and the zirconium tungstate ($ZrW_2Os$) particles obtained in Preparation Example 5, average hydrodynamic diameters of the particles in NMP were measured by using a quasi-elastic light scattering (QELS) system (Malvern Nano-ZS). As a result, the average diameters of the ZnS, $SiO_2$, and $ZrW_2O_8$ particles were 250 nm±50 nm, 120 nm±20 nm, 500 nm±100 nm, respectively.

Figure 16:
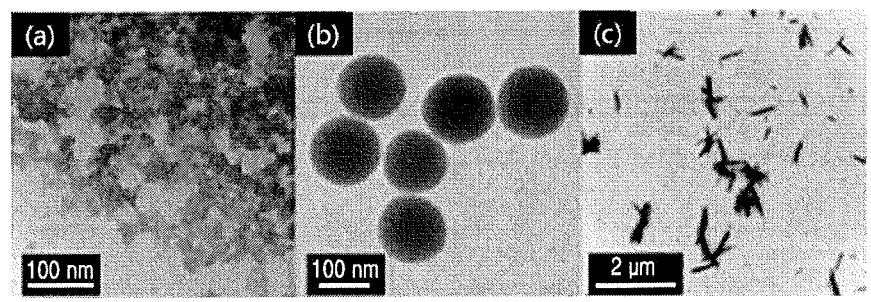
FIG. 16 illustrates TEM images of respective particles obtained in Preparation Examples 1, 4, and 5.

FIG. 16 illustrates respective TEM images of the ZnS particles obtained in Preparation Example 1, the silica ($SiO_2$) particles obtained in Preparation Example 4, and the zirconium tungstate ($ZrW_2O_8$) particles obtained in Preparation Example 5. In FIG. 16, (a) shows the TEM image of the ZnS particles obtained in Preparation Example 1, (b) shows the TEM image of the silica ($SiO_2$) particles obtained in Preparation Example 4, and (c) shows the TEM image of the zirconium tungstate ($ZrW_2O_8$) particles obtained in Preparation Example 5.

Referring to FIG. 16, the ZnS particles had a structure in which relatively small unit crystals having sizes of about 3 nm were agglomerated, whereas the $SiO_2$ and $ZrW_2O_8$ particles were not agglomerated. In addition, the $ZrW_2O_8$ particles exhibited a typical rod-like morphology.

The measurement results of the size of each of the ZnS unit crystals constituting agglomerates of the ZnS particles as shown in (a) of FIG. 16 by XRD are as described in Evaluation Example 1 with reference to FIG. 9.

Evaluation Example 10

Evaluation of CTE of Hybrid Composite Film

To test the possibility of using the ZnS particles as an inorganic particle filler to reduce CTEs of PI films, a hybrid composite film (amount of ZnS particles: 15 wt %) including the ZnS particles obtained in Preparation Example 1 was prepared and measured as to CTE, and the CTE of the hybrid composite film was compared with the CTE of each of hybrid composite films (amount of inorganic particles: 15 wt %) including other inorganic particles ($SiO_2$ and $ZrW_2O_8$).

Figures 17, 18:
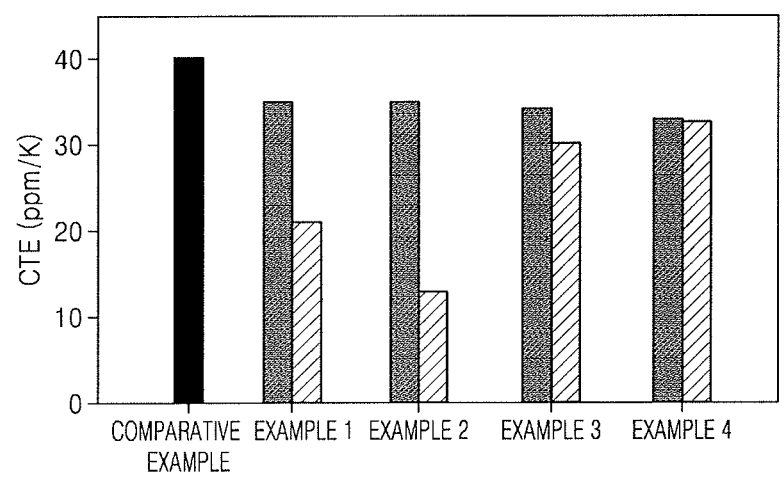
FIG. 17 illustrates a table showing CTEs of films obtained in the Comparative Example and Examples 1 to 4.
FIG. 18 illustrates a graph depicting results of comparison of a calculated value of CTE with an experimental value of CTE for each of hybrid composite films according to Examples 1 to 4.

FIG. 17 illustrates a table showing CTEs of the films obtained in the Comparative Example and Examples 1 to 4.

As shown in FIG. 17, the CTE of the PI film not including inorganic particles was 39.0 ppm/K at a temperature of 30° C. to 200° C., whereas the CTEs of the hybrid composite films respectively including the ZnS, $SiO_2$, and $ZrW_2O_8$ particles synthesized in Preparation Examples 1, 4, and 5 were less than the CTE of the PI film.

In FIG. 17, it can be seen that the CTEs of the hybrid composite films (amount of ZnS particles: 15 wt %) including the ZnS particles according to Examples 1 and 2 were far lower than the CTEs of the hybrid composite films (amount of inorganic particles: 15 wt %) including other inorganic particles ($SiO_2$ and $ZrW_2O_8$) according to Examples 3 and 4. In addition, the hybrid composite film including the ZnS-MPTMS particles according to Example 2 had a lowest CTE (12.0 ppm/K), which was reduced by about 67% from the CTE of the PI film.

Evaluation Example 11

Evaluation of Influences of Inorganic Particles on Hybrid Composite Film

FIG. 18 illustrates a graph depicting results of comparison of a calculated value of CTE with an experimental value of CTE for each of the hybrid composite films (amount of ZnS particles: 15 wt %) including the ZnS particles according to Examples 1 and 2 and the hybrid composite films (amount of inorganic particles: 15 wt %) including other inorganic particles ($SiO_2$ and $ZrW_2O_8$) according to Examples 3 and 4. In FIG. 18, in the case of each of Examples 1 to 4, the left bar of two corresponding bars represents the calculated value of CTE, and the right bar represents the experimental value of CTE.

According to the results of FIG. 18, in the case of each of Examples 1 to 4, the calculated value of CTE was higher than the experimental value of CTE. For example, despite that the intrinsic CTE of ZnS is higher than the intrinsic CTE of each of $SiO_2$ and $ZrW_2O_8$ as described with reference to FIG. 17, the experimental values of CTE of the hybrid composite films of Examples 1 and 2 including the ZnS particles were far lower than the calculated value of CTE of the hybrid composite films of Examples 1 and 2. From these results, it can be understood that the intrinsic CTE of the ZnS particles was not a primary reason of the reduction in CTEs of the hybrid composite films.

Evaluation Example 12

Evaluation of Thermoluminescence Properties of ZnS Particles and Hybrid Composite Films Other factors that could reduce the CTEs of the hybrid composite films including the ZnS particles include thermoluminescence (TL), intrinsic thermal conductivity, and the dispersion states of the ZnS particles.

ZnS is one of inorganic materials exhibiting a TL phenomenon, e.g., a phenomenon of the generation of luminescence by recombination of carriers that are released from surface states or defect sites during heating. Smaller particles may have larger ratios of surface-area/volume than larger particles, and the smaller particles may have more accessible TL carriers than the larger particles. In the present example, it was tested whether the ZnS particles that are agglomerates of the ZnS unit crystals could reduce the CTE of the hybrid composite film by converting heat into radiation.

Figure 19:
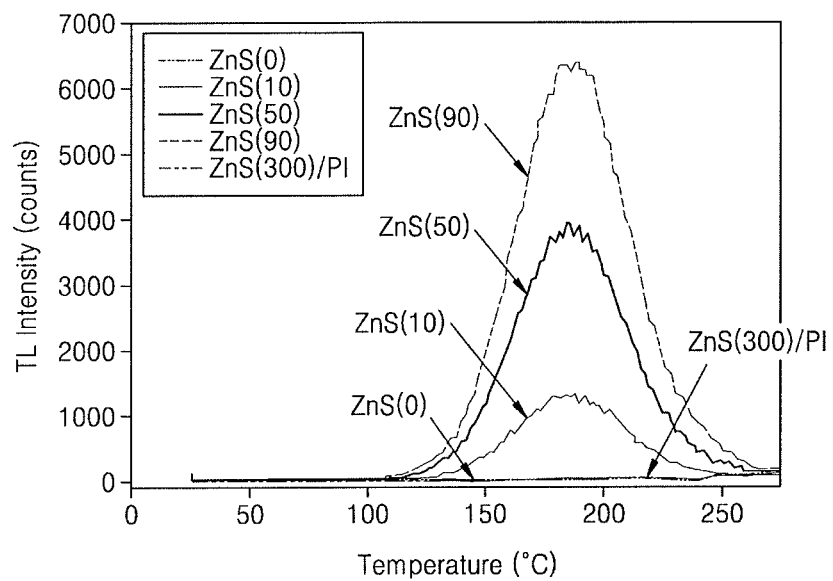
FIG. 19 illustrates a graph depicting TL glow curves of ZnS particles and a hybrid composite film.

FIG. 19 illustrates a graph depicting TL glow curves of the ZnS particles and the hybrid composite film.

In FIG. 19, "ZnS(0)" represents the case of measuring the TL intensity of the ZnS particles without β-radiation, "ZnS (10)" represents the case of measuring the TL intensity of the ZnS particles at a β-radiation dose of 10 mGy, "ZnS(50)" represents the case of measuring the TL intensity of the ZnS particles at a β-radiation dose of 50 mGy, "ZnS(90)" represents the case of measuring the TL intensity of the ZnS particles at a β-radiation dose of 90 mGy, and "ZnS(300)/PI" represents the case of measuring the TL intensity of the hybrid composite film including the ZnS particles that were β-radiated at a dose of 300 mGy.

In FIG. 19, it can be seen that that the TL intensity was zero in the case of "ZnS(0)", and that the TL peak intensity increased with increasing β-radiation dose as shown in the cases of "ZnS(0)", "ZnS(10)", "ZnS(50)", and "ZnS(90)" since the increasing β-radiation dose induced formation of new defect sites inside the ZnS particles and thus allowed additional electron traps. In addition, in FIG. 19, the TL intensity was also significantly low in the case of "ZnS(300)/ PI", and it can be understood that the TL from the ZnS particles was negligible. From the results of FIG. 19, it can be understood that the reduction in CTE of the ZnS/PI composite film was not caused by the TL properties of the ZnS particles.

Influences of the intrinsic thermal conductivity of inorganic particles on CTE will be described with reference to FIG. 17. The heat transport mechanism in non-metals such as polymers is usually explained by the flow of phonons or lattice vibration energy, and the inorganic particles in a hybrid composite film including a polymer and the inorganic particles are believed to form a heat conductive paths or networks, which may decrease heat generated by phonon scattering inside a polymer matrix constituting the hybrid composite film. Therefore, the inorganic particles having high intrinsic thermal conductivity may increase the thermal conductivity of the hybrid composite film by decreasing phonon scattering. When the amount of the inorganic particles in the hybrid composite film is increased, the thermal conductivity of the hybrid composite film may be increased according to the Nelsen equation.

Evaluation Example 13

Evaluation of Thermal Diffusivity of Hybrid Composite Film

To compare heat transfer phenomena in various hybrid composite films, thermal diffusivities of hybrid composite films including various inorganic particles in the same amount (15 wt %) were measured.

Figure 20:
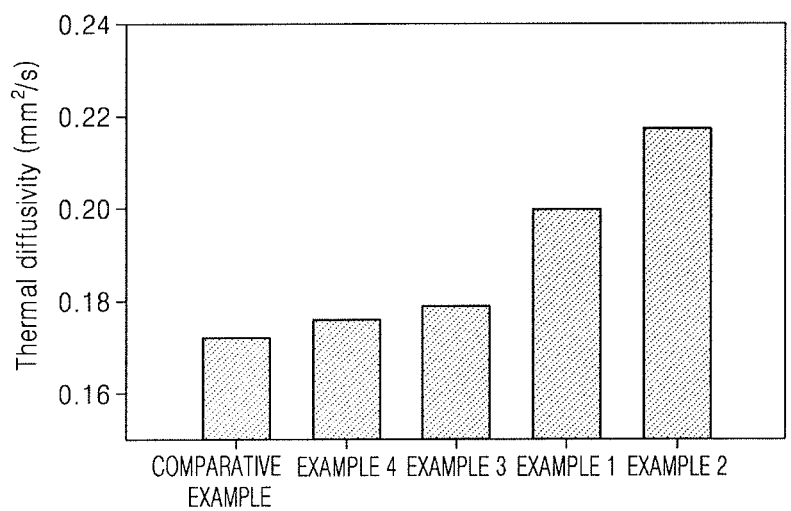
FIG. 20 illustrates a graph depicting thermal diffusivity of various hybrid composite films including a hybrid composite film of the Comparative Example.

FIG. 20 illustrates a graph depicting thermal diffusivities of various hybrid composite films including the hybrid composite film of the Comparative Example.

In FIG. 20, it is shown that the hybrid composite films of Examples 1 and 2 including the ZnS particles had higher thermal diffusivities (0.2 $mm^2/s$ to 0.217 $mm^2/s$) than the hybrid composite film of Example 3 including the $SiO_2$ particles and the hybrid composite film of Example 4 including the $ZrW_2O_8$ particles. Thermal conductivity is obtained by multiplying thermal diffusivity by the specific heat and density of the hybrid composite film, and a difference in thermal conductivity between the hybrid composite films may be greater than a difference in thermal diffusivity therebetween. Based on these results, it can be thought that the ZnS particles formed a thermally conductive network in the hybrid composite films and thus helped heat dissipation and the reduction in CTEs of the hybrid composite films, and this is consistent with the results of FIG. 17.

Even though the ZnS particles not modified with MPTMS according to Example 1 and the ZnS particles modified with MPTMS according to Example 2 had the same intrinsic thermal conductivity as shown in FIG. 17, it can be seen that the thermal diffusivity of the hybrid composite film according to Example 2 was higher than that of the hybrid composite film according to Example 1 as shown in FIG. 20. In addition, from the results of FIG. 17, it can be seen that the CTE of the hybrid composite film according to Example 2 was lower than that of the hybrid composite film according to Example 1.

Evaluation Example 14

Evaluation of Dispersion State of Inorganic Particles within Hybrid Composite Film Dispersion of the inorganic particles in both of a solvent and a polymer matrix is an important issue in the fabrication of the hybrid composite film films, and the dispersion state of the inorganic particles, in addition to the intrinsic thermal conductivity thereof, may also influence the CTEs of the hybrid composite film films. To compare the dispersion states of the ZnS particles in the hybrid composite films, cross-sectional SEM was used.

Figures 21, 22:
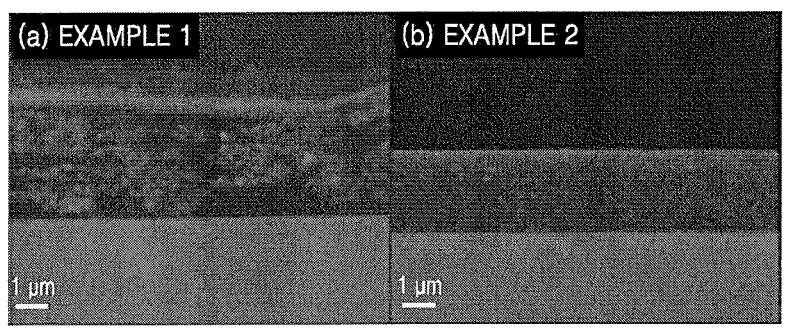
FIG. 21 illustrates SEM images showing results of comparison of dispersion states of ZnS particles in hybrid composite films.
FIG. 22 illustrates a table showing mechanical properties of films according to the Comparative Example and Example 2.

FIG. 21 illustrates SEM images showing results of comparison of the dispersion states of the ZnS particles in the hybrid composite films.

In FIG. 21, (a) shows a cross-sectional SEM image of the hybrid composite film of Example 1 including the ZnS particles in an amount of 15 wt %, and (b) shows a cross-sectional SEM image of the hybrid composite film of Example 2 including the ZnS particles in an amount of 15 wt %.

In the SEM image of each of (a) and (b) of FIG. 21, it is apparently shown that the dispersion state of the ZnS particles in the hybrid composite film of Example 2 was more uniform than the dispersion state of the ZnS particles in the hybrid composite film of Example 1.

Dispersion stability of the ZnS particles in NMP was improved due to surface modification of the ZnS particles with MPTMS in the case of the hybrid composite film of Example 2, and the dispersion state of the ZnS particles surface-modified with MPTMS could be more uniform than the dispersion state of the ZnS particles not surface-modified with MPTMS. In addition, the compatibility between a PI polymer chain and the ZnS particles could be enhanced by hydrogen bonding between hydroxyl groups on surfaces of the ZnS particles surface-modified with MPTMS and PI chains, thereby improving the dispersion of the ZnS particles. The interfacial area between the ZnS particles and the polymer matrix could be increased by improving the dispersion state of the ZnS particles, thereby increasing the thermal diffusivity of the hybrid composite film and reducing the CTE thereof. Therefore, the intrinsic thermal conductivity and dispersion state of the ZnS particles surface-modified with MPTMS could be mainly responsible for the significant reduction in the CTE of the hybrid composite film.

Evaluation Example 15

Evaluation of Mechanical Properties of Hybrid Composite Film

FIG. 22 illustrates a table showing mechanical properties of the PI film according to the Comparative Example and the hybrid composite film including the ZnS particles surface-modified with MPTMS in an amount of 15 wt % according to Example 2.

In a hybrid composite film, phase separation induced by low interfacial interaction between inorganic particles and polymer chains can deteriorate mechanical modulus. The ZnS particles surface-modified with MPTMS were uniformly dispersed within the PI film as shown in (b) of FIG. 21, and the tensile strength and tensile modulus of the hybrid composite film were respectively increased approximately 1.6-fold and 1.9-fold as compared with the PI film according to the Comparative Example. On the other hand, the elongation of the hybrid composite film was slightly decreased because the inorganic particles within the hybrid composite film could hinder the PI film from stretching.

The ZnS particles may be able to absorb light of a wavelength of 300 nm or less and are not able to absorb light in the visible wavelength range. Therefore, the reduction in transmittance of the hybrid composite film in a wavelength range of 400 nm to 700 nm could be mainly caused by light scattering due to the introduction of the ZnS particles. As shown in FIG. 15 showing the transmittance of each of the PI film according to the Comparative Example and the hybrid composite films including the ZnS particles surface-modified with MPTMS in different amounts according to Example 2, although the transmittance gradually decreased with increasing amount of the inorganic particles in the hybrid composite films, the reduction in transmittance of the hybrid composite films was not significant up to an amount of 15 wt % of the inorganic particles, and the hybrid composite film according to Example 2 exhibited optical and mechanical properties comparable to the PI film according to Comparative Example. From these results, it can be understood that the hybrid composite film according to Example 2 can be applied to processes of fabricating various optoelectronic devices.

When the ZnS particles are used as the inorganic particles constituting the organic-inorganic composite particles included in the hybrid composite film, the ZnS particles may exhibit excellent structural stability at high temperatures and excellent chemical stability and have lower CTE and higher hardness than the polymer film constituting the hybrid composite film. In addition, the ZnS particles may have relatively high thermal conductivity, and the ZnS particles may improve thermal stability of the hybrid composite film as well as mechanical properties of the polymer film constituting the hybrid composite film. Therefore, even though the ZnS particles are present in a relatively low amount in the hybrid composite film according to an embodiment, the reliability of the hybrid composite film may be secured by controlling the CTE of the polymer film.

By way of summation and review, to protect the integrated circuit devices from external environments, polymer insulating films may be used. Polymer insulating films may suffer from defects such as cracking or peeling-off due to, e.g., a difference in coefficients of thermal expansion from silicon-containing films or metal-containing films. Securing the reliability of the integrated circuit devices may be desirable.

As integrated circuit devices become higher-integrated and smaller, heat management is important in processes of fabricating integrated circuit devices. The hybrid composite film according to an embodiment may provide a relatively low CTE without deteriorating optical and mechanical properties of the polymer film even when the amount of the inorganic particles is relatively low. This may be caused by the intrinsic thermal conductivity and improved dispersion state of the plurality of inorganic particles included in the hybrid composite film according to an embodiment. Therefore, in the integrated circuit device using the hybrid composite film according to embodiments, defects such as such as interface cracking, peeling-off, or the like due to a difference in CTE may be reduced or prevented. In addition, the hybrid composite film according to an embodiment may include a low-expansion polymer, and thereby may improve the reliability of a semiconductor package when applied to the semiconductor package. Further, the hybrid composite film according to an embodiment may be applied to a process of fabricating an integrated circuit device, thereby significantly improving the reliability of the integrated circuit device.

The embodiments may provide a hybrid composite film having relatively low coefficient of thermal expansion and relatively high thermal conductivity.

The embodiments may provide an integrated circuit device that may secure reliability without defects such as cracking or peeling-off.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hybrid composite film, comprising:
   a polymer film; and
   a plurality of organic-inorganic composite particles dispersed in the polymer film,
   wherein each particle of the plurality of organic-inorganic composite particles includes an inorganic particle and an organic capping layer surrounding the inorganic particle, the organic capping layer having a hydroxyl group-terminated end.

2. The hybrid composite film as claimed in claim 1, wherein the inorganic particle has a particle size of about 1 nm to about 900 nm.

3. The hybrid composite film as claimed in claim 1, wherein the organic capping layer includes a siloxane linkage.

4. The hybrid composite film as claimed in claim 1, wherein the organic capping layer includes a silanol group.

5. The hybrid composite film as claimed in claim 1, wherein the organic capping layer includes a C1 to C10 alkylene group.

6. The hybrid composite film as claimed in claim 1, wherein the inorganic particle includes an inorganic sulfide, an inorganic nitride, an inorganic oxide, or a combination thereof.

7. The hybrid composite film as claimed in claim 1, wherein the inorganic particle includes ZnS, AlN, BN, or a combination thereof.

8. The hybrid composite film as claimed in claim 1, wherein:
   the polymer film includes a polyimide, and
   the inorganic particle includes ZnS.

9. The hybrid composite film according as claimed in claim 1, wherein the inorganic particle is present in an amount of about 1 wt % to about 25 wt %, based on a total weight of the polymer film and the inorganic particle.

10. An integrated circuit device, comprising:
    a semiconductor device; and
    a hybrid composite film covering the semiconductor device,
    wherein the hybrid composite film includes a polymer film and a plurality of organic-inorganic composite particles dispersed in the polymer film, and
    each particle of the plurality of organic-inorganic composite particles includes an inorganic particle and an organic capping layer surrounding the inorganic particle, the organic capping layer having a hydroxyl group-terminated end.

11. The integrated circuit device as claimed in claim 10, wherein the inorganic particle has a particle size of about 1 nm to about 900 nm.

12. The integrated circuit device as claimed in claim 10, wherein the organic capping layer includes a siloxane linkage.

13. The integrated circuit device as claimed in claim 10, wherein the organic capping layer includes a silanol group and a C1 to C10 alkylene group.

14. The integrated circuit device as claimed in claim 10, wherein the inorganic particle includes an inorganic sulfide, an inorganic nitride, an inorganic oxide, or a combination thereof.

* * * * *